(12) United States Patent
Kubota et al.

(10) Patent No.: US 10,347,698 B2
(45) Date of Patent: Jul. 9, 2019

(54) ELECTROOPTICAL DEVICE, MANUFACTURING METHOD OF ELECTROOPTICAL DEVICE, AND ELECTRONIC EQUIPMENT

(71) Applicant: SEIKO EPSON CORPORATION, Tokyo (JP)

(72) Inventors: Naotaka Kubota, Chino (JP); Takeshi Koshihara, Matsumoto (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 15/916,135

(22) Filed: Mar. 8, 2018

(65) Prior Publication Data

US 2018/0277610 A1    Sep. 27, 2018

(30) Foreign Application Priority Data

Mar. 24, 2017 (JP) ................. 2017-058702

(51) Int. Cl.

| H01L 29/08 | (2006.01) |
|---|---|
| H01L 35/24 | (2006.01) |
| H01L 51/00 | (2006.01) |
| H01L 27/32 | (2006.01) |
| H01L 51/52 | (2006.01) |
| H01L 51/56 | (2006.01) |
| G02B 27/01 | (2006.01) |

(52) U.S. Cl.
CPC ........ *H01L 27/322* (2013.01); *H01L 27/3272* (2013.01); *H01L 51/0031* (2013.01); *H01L 51/5237* (2013.01); *H01L 51/5253* (2013.01); *H01L 51/56* (2013.01); *G02B 27/0172* (2013.01)

(58) Field of Classification Search
CPC .............. H01L 27/322; H01L 51/5253; H01L 51/0031; H01L 51/56; H01L 51/5237; H01L 27/3272; G02B 27/0172
See application file for complete search history.

(56) References Cited

U.S. PATENT DOCUMENTS

| 7,965,266 B2* | 6/2011 | Yamaguchi | ......... G02F 1/13338 345/45 |
|---|---|---|---|
| 2009/0068351 A1* | 3/2009 | Ito | ..................... H01L 27/3246 427/162 |
| 2011/0140110 A1* | 6/2011 | Fujikawa | ............ H01L 27/1229 257/57 |

(Continued)

FOREIGN PATENT DOCUMENTS

| JP | 2003-218334 A | 7/2003 |
|---|---|---|
| JP | 2014-089804 A | 5/2014 |

*Primary Examiner* — Ismail A Muse
(74) *Attorney, Agent, or Firm* — Oliff PLC

(57) ABSTRACT

An organic EL device as an electrooptical device includes an organic EL element, a sealing member, a color filter, a dimension evaluation pattern, and a pedestal member. The organic EL element is disposed for each subpixel, in a display area of a base as a substrate. The sealing member includes a sealing layer that covers the organic EL element. The color filter is provided on the sealing layer. The dimension evaluation pattern is provided as an evaluation pattern for evaluating the color filter. The pedestal member is disposed between an end portion of the base and the sealing member. The dimension evaluation pattern is disposed on the pedestal member.

20 Claims, 16 Drawing Sheets

(56) References Cited

U.S. PATENT DOCUMENTS

| | | |
|---|---|---|
| 2014/0117842 A1 | 5/2014 | Hanamura |
| 2016/0011478 A1* | 1/2016 | Nakamura ........ G02F 1/133345 257/72 |
| 2017/0236879 A1* | 8/2017 | Kubota .............. G02B 27/0172 257/40 |
| 2018/0026068 A1* | 1/2018 | Ogi ................... H01L 27/14627 257/432 |
| 2018/0088726 A1* | 3/2018 | Gwon .................... G06F 3/0412 |
| 2018/0183133 A1* | 6/2018 | Yamazaki ............ H01Q 1/2258 |
| 2018/0307368 A1* | 10/2018 | Koide ................. G02F 1/13338 |

* cited by examiner

ELECTROOPTICAL DEVICE, MANUFACTURING METHOD OF ELECTROOPTICAL DEVICE, AND ELECTRONIC EQUIPMENT

BACKGROUND

1. Technical Field

The present invention relates to an electrooptical device, a manufacturing method of the electrooptical device, and electronic equipment including the electrooptical device.

2. Related Art

An organic electro-luminescence device including an organic EL element for each pixel is known as an electrooptical device. Since an organic EL element can be reduced in size and thickness in comparison to a light emitting diode (LED), application to a micro-display such as a head mount display (HMD) or an electronic viewfinder (EVF) attracts attentions. A configuration in which an organic EL element of obtaining white light emission and a color filter are assembled is proposed as means for realizing color display in such a micro-display (see JP-A-2014-089804).

In an organic EL device disclosed in JP-A-2014-089804, a sealing layer that covers a plurality of organic EL elements arranged on a substrate is formed, and a color filter configured with coloring layers of the red (R), green (G), and blue (B) colors is formed on the sealing layer by a photolithography method. The coloring layers constituting the color filter are distinguished from each other by convex portions which are disposed on the sealing layer and have a height lower than that of each of the coloring layers. Thus, edge portions of the coloring layers which are adjacent to each other are in contact with each other, or one edge portion overlaps the other edge portion.

SUMMARY

In an organic EL device as a micro-display having a small pixel size, in order to obtain favorable viewing angle characteristics, it is necessary that a coloring layer constituting a color filter is formed with high precision for each organic EL element. Accordingly, in a manufacturing process of a color filter, it is desirable that management characteristics (for example, dimensions or position) of a coloring layer is controlled with high precision. However, as disclosed in JP-A-2014-089804, in a case where coloring layers are formed such that edge portions of the coloring layers which are adjacent to each other are in contact with each other or one edge portion overlaps the other edge portion, there is a problem in that it is difficult to accurately measure dimensions or the position of each of the coloring layers.

The invention can be realized in the following aspects or application examples.

Application Example

According to this application example, there is provided an electrooptical device which includes a substrate, an organic EL element disposed for each pixel, in a first area of the substrate, a sealing member that is provided in the first area and covers the organic EL element, a color filter provided on the sealing member, an evaluation pattern provided for evaluating the color filter, and a pedestal member disposed between an end portion of the substrate and the sealing member. The evaluation pattern is disposed on the pedestal member.

According to the application example, if dimensions, the position, and the like of the evaluation pattern are measured, it is possible to obtain information regarding management characteristics (such as dimensions and the position) of a coloring layer constituting the color filter. Since the evaluation pattern is disposed on the pedestal member of the substrate, it is possible to suitably obtain the information regarding the management characteristics of the coloring layer of the color filter provided on the sealing member, in comparison to a case where the evaluation pattern is not disposed on the pedestal member. Further, since the pedestal member is disposed between the end portion of the substrate and the sealing member, it is difficult that light emitted from the organic EL element is transmitted through the evaluation pattern and influences light emission relating to display in the first area, in comparison to a case where the evaluation pattern is provided on the sealing member in a similar manner to that for the color filter. That is, it can be evaluated whether or not the coloring layer is suitably and high-precisely disposed for the organic EL element in a pixel, by using the evaluation pattern in a manufacturing process, and management according to the evaluation can be performed. Thus, it is possible to provide an electrooptical device in which display characteristics such as viewing angle characteristics in a favorable state can be realized. In particular, in comparison to a case where coloring layers which are adjacent to each other on the sealing member do not overlap each other, it is effective that it is possible to suitably obtain the information regarding the management characteristics of the coloring layer of the color filter by the evaluation pattern, in a case where the color filter is formed such that edge portions of the coloring layers which are adjacent to each other are in contact with each other or one edge portion overlaps the other edge portion.

In the electrooptical device according to this application example, it is preferable that the height of the pedestal member be substantially equal to the height of the sealing member, on the substrate.

According to this configuration, the evaluation pattern can be provided under exposure conditions which are substantially the same as exposure conditions when the color filter provided on the sealing member is manufactured. Thus, it is possible to obtain the information regarding the management characteristics of the coloring layer of the color filter with high precision. The phrase of being substantially the same means that the height of the pedestal member based on the height of the sealing member is in a range of variation in forming accuracy in the manufacturing process and is in a range of 90% to 110%.

In the electrooptical device according to this application example, it is preferable that the sealing member include an organic sealing layer and inorganic sealing layers interposing the organic sealing layer, and the pedestal member have a layer configuration which is the same as that of the sealing member.

According to this configuration, since the sealing member is configured with an inorganic sealing layer having difficulty in transmission of a gas or a liquid, and an organic sealing layer which is easily flattened, it is possible to protect the organic EL element which is easily inactivated by an influence of moisture, oxygen, or the like, by the sealing member, and to flatten the sealing member on which the color filter is provided. Further, since the pedestal member is set to have a layer configuration which is the same as that of the sealing member, it is possible to reduce a difference of a shape between the coloring layer of the color filter on the sealing member and the evaluation pattern on the pedestal member.

Application Example

According to this application example, it is preferable that another electrooptical device include a substrate, an organic EL element disposed for each pixel, in a first area of the substrate, a sealing member that is provided in the first area and covers the organic EL element, a color filter provided on the sealing member, an evaluation pattern provided for evaluating the color filter, a light shielding member provided over the evaluation pattern, so as to surround the first area, and translucent members which are n layers and are provided between the evaluation pattern and the light shielding member. It is preferable that the evaluation pattern be provided at a position satisfying Expression (1).

$$Lp > \Sigma(Ln \times \tan \theta_n) \quad (1)$$

n indicates an integer of 1 or more, Lp indicates a distance from an end portion of the light shielding member on the first area side to an end portion of the evaluation pattern in plan view, Ln indicates a thickness of each of the translucent members of n layers on the evaluation pattern, and $\theta_n$ indicates an angle of light to a normal line of each of the translucent members when the light emitted in a direction inclined from a normal line of an end portion of the evaluation pattern is transmitted to the corresponding translucent member.

According to the application example, if dimensions, the position, and the like of the evaluation pattern are measured, it is possible to obtain information regarding management characteristics (such as dimensions and the position) of a coloring layer constituting the color filter. The translucent members of n layers are disposed between the evaluation pattern and the light shielding member. Since the distance from the end portion of the light shielding member on the first area side to the end portion of the evaluation pattern satisfies Expression (1), it is possible to suppress an occurrence of a situation in which light emitted from the organic EL element is transmitted through the evaluation pattern and then transmitted through the translucent members of n layers, and thus influences light emission relating to display in the first area. Specifically, the reason is that an incident position and an emitted position of the inclined light with respect to each of the translucent members are measured in accordance with an angle of the translucent member to the normal line thereof when inclined light which is emitted in a direction inclined from the normal line of the end portion of the evaluation pattern is transmitted through the translucent member, and the thickness of each of the translucent members. That is, it can be evaluated whether or not the coloring layer is suitably and high-precisely disposed for the organic EL element in a pixel, by using the evaluation pattern in a manufacturing process, and it is possible to suppress light leakage occurring by providing the evaluation pattern. Accordingly, it is possible to provide an electrooptical device in which display characteristics such as viewing angle characteristics in a favorable state can be realized, and which has excellent display quality. In particular, in comparison to a case where coloring layers which are adjacent to each other on the sealing member do not overlap each other, it is effective that it is possible to obtain the information regarding the management characteristics of the coloring layer of the color filter by the evaluation pattern, in a case where the color filter is formed such that edge portions of the coloring layers which are adjacent to each other are in contact with each other or one edge portion overlaps the other edge portion.

In the electrooptical device according to the application example, it is preferable that a pedestal member disposed between the end portion of the substrate and the sealing member be provided and the evaluation pattern be disposed on the pedestal member.

According to this configuration, since the evaluation pattern is disposed on the pedestal member of the substrate, it is possible to suitably obtain the information regarding the management characteristics of the coloring layer of the color filter provided on the sealing member, in comparison to a case where the evaluation pattern is not disposed on the pedestal member.

In the electrooptical device according to this application example, it is preferable that the translucent members of n layers include an adhesive layer configured to cover the color filter and the evaluation pattern and a counter substrate stacked on the adhesive layer.

According to this configuration, it is possible to protect the color filter and the evaluation pattern by the counter substrate stacked with the adhesive layer interposed therebetween, and to prevent an occurrence of a situation in which moisture, oxygen, or the like is permeated into the sealing member, by the counter substrate. In other words, even though the adhesive layer and the counter substrate as the translucent members of n layers are disposed between the evaluation pattern and the light shielding member, since Expression (1) is satisfied, it is possible to dispose the evaluation pattern at the proper position and to prevent light leakage which has an influence on display. That is, it is possible to provide an electrooptical device having excellent display quality and durability.

In the electrooptical device according to the application example, the light shielding member may a case member provided to surround the first area and the adhesive layer and the counter substrate may be disposed between the evaluation pattern and the case member.

According to this configuration, since the adhesive layer and the counter substrate constitute the translucent members of n layers disposed between the evaluation pattern and the case member, and the distance Lp from the end portion of the case member on the first area side to the end portion of the evaluation pattern satisfies Expression (1), it is possible to cause the case member to block light leakage occurring by providing the evaluation pattern.

In the electrooptical device according to this application example, the light shielding member may be a light shielding layer provided at an interface between the counter substrate and the adhesive layer or on a surface of the counter substrate on an opposite side of the interface.

According to this configuration, in a case where the light shielding layer as the light shielding member is provided at the interface between the counter substrate and the adhesive layer, the adhesive layer constitutes the translucent member. In a case where the light shielding layer as the light shielding member is provided on the surface of the counter substrate on an opposite side of the interface, the adhesive layer and the counter substrate constitute the translucent members of n layers. Even in any case, since the distance Lp from the end portion of the light shielding layer on the first area side to the end portion of the evaluation pattern satisfies Expression (1), it is possible to block light leakage occurring by providing the evaluation pattern, by the light shielding layer provided on the counter substrate.

As described in the above-described application example, the light shielding layer as the light shielding member can be disposed to be closer to the evaluation pattern than that in a case where the case member is set as the light shielding member. Thus, it is possible to reduce the distance Lp. In other words, it is possible to reduce a range in which the evaluation pattern can be disposed when light leakage is considered. Accordingly, it is possible to obtain a compact electrooptical device which allows providing of the evaluation pattern.

In the electrooptical device according to the application example, it is preferable that the evaluation pattern include color patterns of at least three colors of red, green, and blue in order to evaluate dimension precision of a coloring layer of the color filter, and the color patterns of at least three colors of red, green, and blue be arranged to be spaced from each other.

According to this configuration, since the color patterns of at least three colors of red, green, and blue, which constitute the evaluation pattern are arranged to be spaced from each other, it is possible to accurately measure dimensions, the position, and the like of each of the color patterns. It is possible to obtain information regarding management characteristics of the coloring layer in the color filter, based on measurement results of the color patterns.

In the electrooptical device according to the application example, it is preferable that the color patterns include a plurality of patterns for each color, and the plurality of patterns be arranged to be spaced from each other.

According to this configuration, even if one of the plurality of patterns deforms or disappears, it is possible to obtain information regarding the management characteristics of the coloring layer in the color filter by measuring other patterns.

In the electrooptical device according to the application example, one of the plurality of patterns in the color pattern may have a shape which is different from other patterns.

According to this configuration, it is possible to recognize position shift or the like of the coloring layer of the corresponding color in the color filter by identifying a specific pattern from the plurality of patterns or by comparing the patterns which are different from each other.

In the electrooptical device according to the application example, it is preferable that a position evaluation pattern for evaluating position precision of a coloring layer of the color filter be provided on the substrate, and the position evaluation pattern be provided to correspond to each of at least three colors of red, green, and blue.

According to this configuration, it is possible to obtain information regarding position precision of the coloring layer of the color filter with respect to the organic EL element, by the position evaluation pattern. In a case where precision obtained for dimensions or the like and precision obtained for the position in the coloring layer of the color filter are different from each other, the position evaluation pattern can be configured based on the required precision.

Application Example

According to this application example, there is provided electronic equipment including the electrooptical device according to the application examples.

According to the application example, since an electrooptical device in which display characteristics such as viewing angle characteristics in a favorable state can be realized is provided, it is possible to provide electronic equipment which performs favorable showing in display.

Application Example

According to this application example, there is provided a manufacturing method of an electrooptical device, which includes forming an organic EL element for each pixel, in a first area of a substrate, forming a sealing member for covering the organic EL element over the first area, forming a color filter on the sealing member, and forming a pedestal member between an end portion of the substrate and the sealing member. In the forming of the color filter, a coloring layer of the color filter is formed by a photolithography method and an evaluation pattern for evaluating the color filter is formed on the pedestal member by the photolithography method with a formation material for the coloring layer.

According to the application example, if dimensions, the position, and the like of the evaluation pattern which has been formed along with the coloring layer are measured, it is possible to obtain information regarding management characteristics (such as dimensions and the position) of the coloring layer in the forming of the color filter. Since the evaluation pattern is formed on the pedestal member of the substrate, it is possible to reduce a difference between the position of the coloring layer on the substrate and the position of the evaluation pattern during exposing, in comparison to a case where the evaluation pattern is not formed on the pedestal member. Thus, it is possible to suitably obtain information regarding the management characteristics of the coloring layer of the color filter, since a difference between precision when the coloring layer is formed and precision when the evaluation pattern is formed occurs less frequently. Further, since the pedestal member is formed between the end portion of the substrate and the sealing member, it is difficult that light emitted from the organic EL element is transmitted through the evaluation pattern and influences light emission relating to display in the first area, in comparison to a case where the evaluation pattern is formed on the sealing member in a similar manner to that for the color filter. That is, it can be evaluated whether or not the coloring layer is suitably and high-precisely formed for the organic EL element in a pixel, by using the evaluation pattern in a manufacturing process. Thus, it is possible to manufacture an electrooptical device in which display characteristics such as viewing angle characteristics in a favorable state can be realized. In particular, in the forming of the color filter, in comparison to a case where coloring layers which are adjacent to each other on the sealing member are formed not to overlap each other, it is effective that it is possible to suitably obtain the information regarding the management characteristics of the coloring layer of the color filter by the evaluation pattern, in a case where the color filter is formed such that edge portions of the coloring layers which are adjacent to each other are in contact with each other or one edge portion overlaps the other edge portion.

Application Example

According to this application example, there is provided another manufacturing method of an electrooptical device, which includes forming an organic EL element for each pixel, in a first area of a substrate, forming a sealing member for covering the organic EL element over the first area, forming a color filter on the sealing member, forming an evaluation pattern for evaluating the color filter, disposing translucent members of n layers on the evaluation pattern, and disposing a light shielding member over the evaluation pattern, so as to surround the first area. The evaluation pattern is formed at a position satisfying Expression (1).

$$Lp > \Sigma(Ln \times \tan \theta_n) \qquad (1)$$

n indicates an integer of 1 or more, Lp indicates a distance from an end portion of the light shielding member on the first area side to an end portion of the evaluation pattern in plan view, Ln indicates a thickness of each of the translucent members of n layers on the evaluation pattern, and $\theta_n$ indicates an angle of light to a normal line of each of the translucent members of n layers when the light emitted in a direction inclined from a normal line of an end portion of the evaluation pattern is transmitted to the corresponding translucent member.

According to the application example, if dimensions, the position, and the like of the evaluation pattern are measured, it is possible to obtain information regarding management characteristics (such as dimensions and the position) of the coloring layer in the forming of the color filter. The translucent members of n layers are disposed between the evaluation pattern and the light shielding member. Since the evaluation pattern is formed so as to cause the distance from the end portion of the light shielding member on the first area side to the end portion of the evaluation pattern satisfies Expression (1), it is possible to suppress an occurrence of a situation in which light emitted from the organic EL element is transmitted through the evaluation pattern and then transmitted through the translucent members of n layers, and thus influences light emission relating to display in the first area. Specifically, the reason is that an incident position and an emitted position of the inclined light with respect to each of the translucent members are measured in accordance with an angle of the translucent member to the normal line thereof when inclined light which is emitted in a direction inclined from the normal line of the end portion of the evaluation pattern is transmitted through the translucent member, and the thickness of each of the translucent members. That is, it can be evaluated whether or not the coloring layer is suitably and high-precisely disposed for the organic EL element in a pixel, by using the evaluation pattern in a manufacturing process, and to suppress light leakage occurring by forming the evaluation pattern. Accordingly, it is possible to provide an electrooptical device in which display characteristics such as viewing angle characteristics in a favorable state can be realized, and which has excellent display quality. In particular, in the forming of the color filter, in comparison to a case where coloring layers which are adjacent to each other on the sealing member are formed not to overlap each other, it is effective that it is possible to obtain the information regarding the management characteristics of the coloring layer of the color filter by the evaluation pattern, in a case where the color filter is formed such that edge portions of the coloring layers which are adjacent to each other are in contact with each other or one edge portion overlaps the other edge portion.

In the manufacturing method of an electrooptical device according to the application example, in the forming of the color filter, the coloring layer and the evaluation pattern may be formed on a mother substrate by a photolithography method and by using the mother substrate on which a plurality of substrates are mounted, the formation material for the coloring layer of the color filter, and an exposure reticle which is capable of exposing at least two substrates or more together. The exposure reticle may include an exposure pattern which allows exposure of evaluation patterns of the at least two substrates.

According to this method, the evaluation pattern may not be formed on all of the plurality of substrates mounted on the mother substrate. That is, since the exposure pattern for the evaluation pattern is properly disposed in the exposure reticle, it is possible to specify the evaluation pattern used for measurement for obtaining information regarding the management characteristics of the coloring layer of the color filter, in the mother substrate. In other words, a worker easily specifies the evaluation pattern as a measurement target. In addition, since measurement may not be performed on all substrates on the mother substrate, work efficiency is improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, exemplary embodiments for embodying the invention will be described with reference to the drawings. The drawings to be used are illustrated in a manner of appropriately enlarged or reduction for causing a part as a description target to be in a recognizable state.

First Exemplary Embodiment

Electronic Equipment

Figure 1:
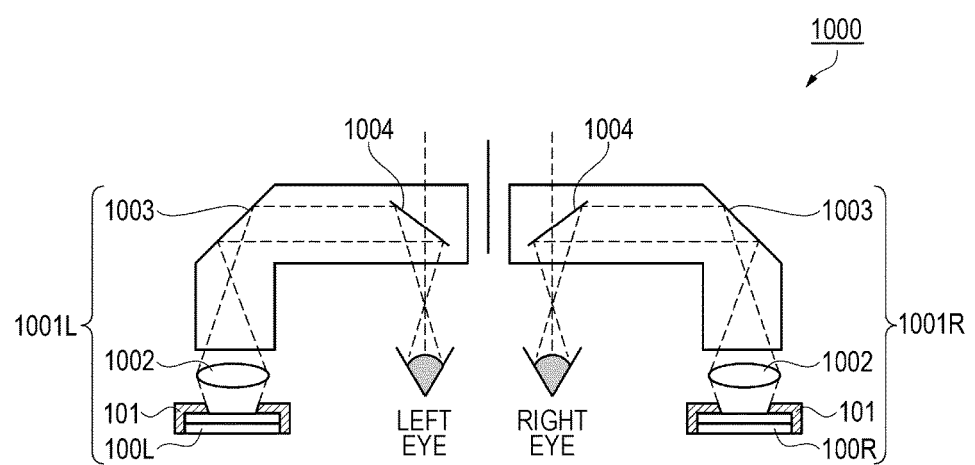
FIG. 1 is a schematic diagram illustrating a head mount display as electronic equipment.

Firstly, a head mount display (HMD) as an example of electronic equipment in which an electrooptical device according to the exemplary embodiment is applied to a display unit will be described with reference to FIG. 1. FIG. 1 is a schematic diagram illustrating the head mount display as the electronic equipment.

The head mount display (HMD) 1000 includes a pair of optical units 1001L and 1001R, a mounting unit (not illustrated), a power supply unit, a control unit (not illustrated), and the like. The pair of optical units 1001L and 1001R respectively correspond to the right and left eyes and are provided for displaying information. The mounting unit is provided for mounting the pair of optical units 1001L and 1001R on the head of a user. Here, since the pair of optical unit 1001L and 1001R has a configuration of vertical symmetry, the optical unit 1001R for the right eye will be described as an example.

The optical unit 1001R includes a display unit 100R, a condensing optical system 1002, and a light guide 1003 bent in an L shape. A half mirror layer 1004 is provided in the light guide 1003. In the optical unit 1001R, display light emitted from the display unit 100R is incident to the light guide 1003 by the condensing optical system 1002. Then, the display light is reflected by the half mirror layer 1004 and is guided to the right eye. The display light (image) projected to the half mirror layer 1004 is a virtual image. Thus, the user can recognize both display (virtual image) formed by the display unit 100R and display of the outside world in front of the half mirror layer 1004. That is, the HMD 1000 is a transmission type (see-through type) projection type display apparatus.

The light guide 1003 is obtained by assembling rod lenses, and constitutes a rod integrator. The condensing optical system 1002 and the display unit 100R are disposed on a side of the light guide 1003, onto which light is incident. The rod lens receives display light condensed by the condensing optical system 1002. The half mirror layer 1004 of the light guide 1003 has an angle at which light flux which has been condensed by the condensing optical system 1002 and has propagated with being totally reflected in the rod lenses is reflected toward the right eye.

The display unit 100R can display a display signal transmitted from the control unit, in a display area as image information of letters, an image, or the like. The image information to be displayed is converted from a real image into a virtual image by the condensing optical system 1002. In the exemplary embodiment, a spontaneous emission type organic EL device 100 which is an electrooptical device which will be described later in the exemplary embodiment is applied to the display unit 100R. A frame-like case member 101 is provided on the condensing optical system 1002 side of the display unit 100R, so as to surround the display area, and thus light emitted from an area other than the display area of the display unit 100R does not have an influence on display obtained by condensing at the condensing optical system 1002.

As described above, the optical unit 1001L for the left eye also includes a display unit 100L to which the organic EL device 100 which will be described later in the exemplary embodiment is applied. The configuration and functions of the optical unit 1001L are the same those of the optical unit 1001R for the right eye.

According to the exemplary embodiment, since the organic EL device 100 of a spontaneous emission type is applied as the display units 100L and 100R, an illumination device such as a backlight is not required in comparison to a case using a light-receiving liquid crystal device. Thus, it is possible to provide a see-through type HMD 1000 which is compact and lightweight, and has favorable showing.

The HMD 1000 to which the organic EL device 100 in the exemplary embodiment is applied is not limited to the configuration in which the pair of optical unit 1001L and 1001R corresponding to both the eyes are provided, and may have a configuration in which one optical unit 1001R is provided. The HMD 1000 is not limited to the see-through type, and may be an immersive type in which display is visually recognized in a state where outdoor light is blocked.

Organic EL Device

Figure 2:
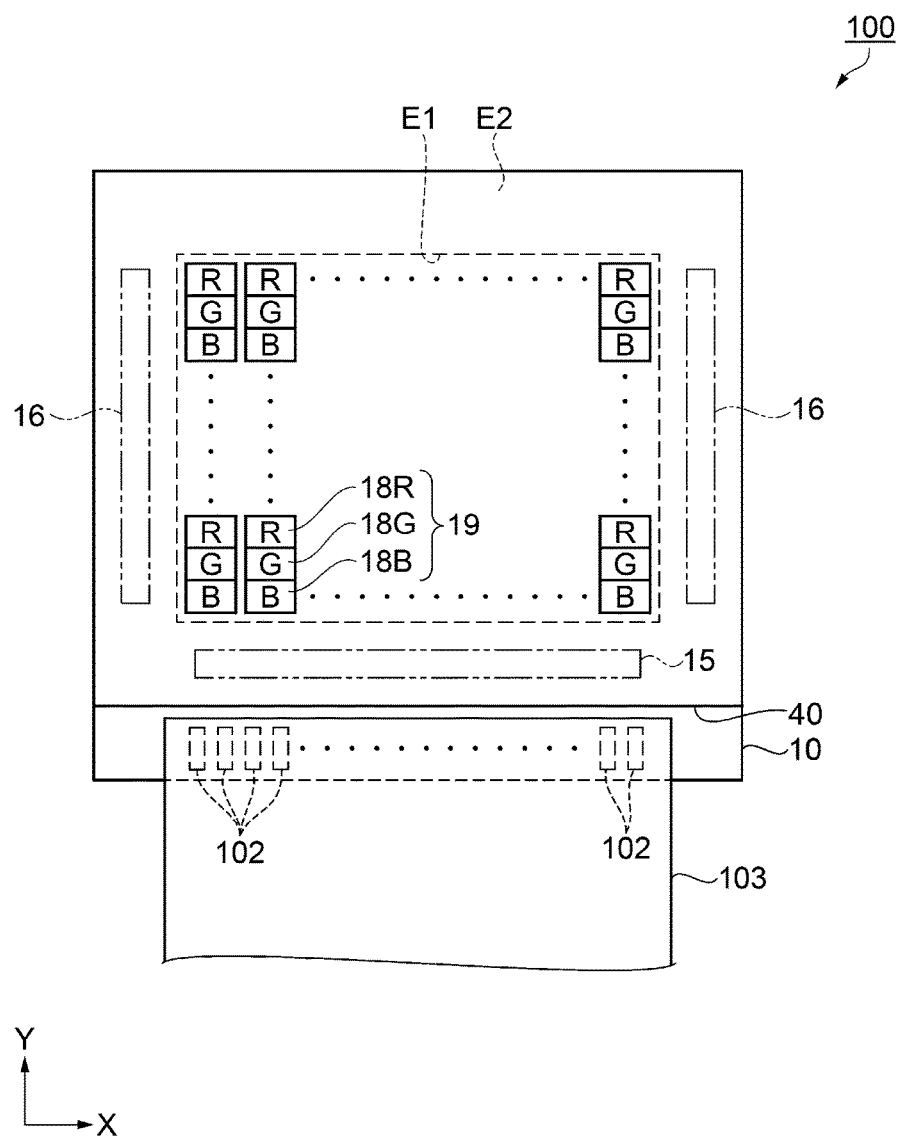
FIG. 2 is a plan view schematically illustrating a configuration of an organic EL device according to a first exemplary embodiment.
Figure 3:
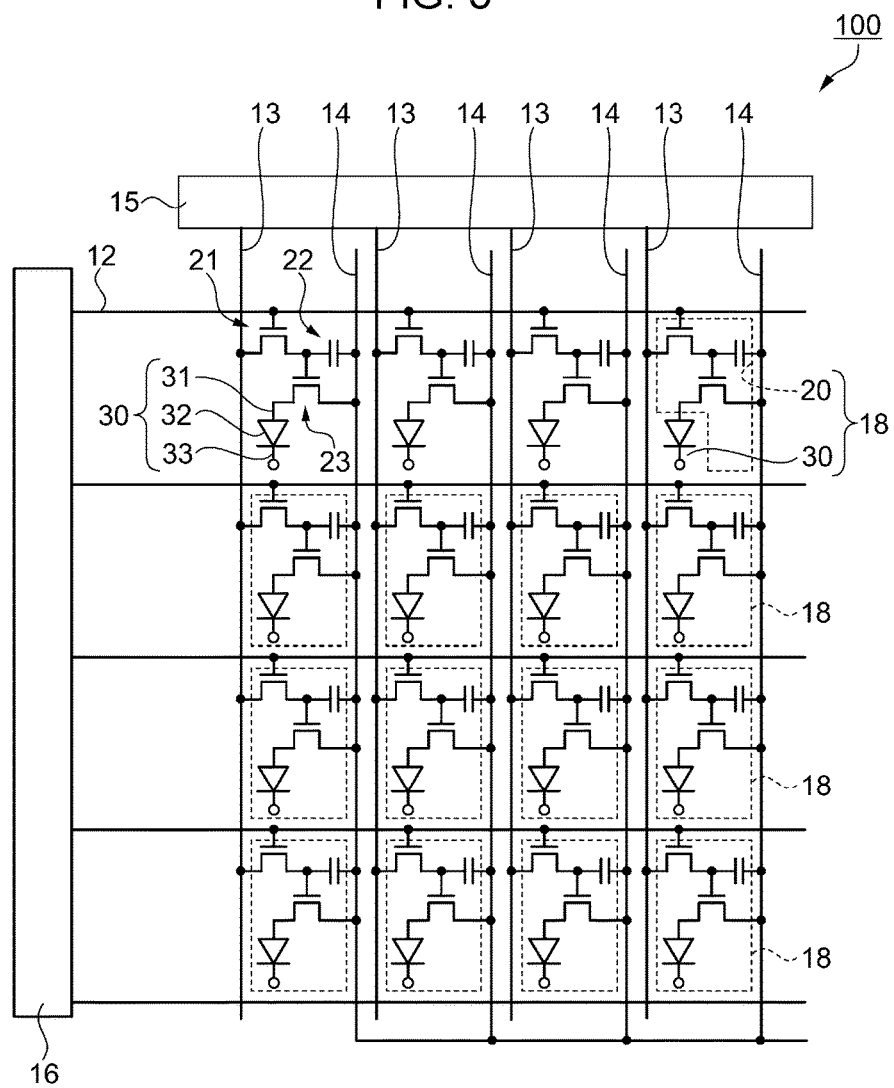
FIG. 3 is an equivalent circuit diagram illustrating an electrical configuration of the organic EL device according to the first exemplary embodiment.
Figure 4:
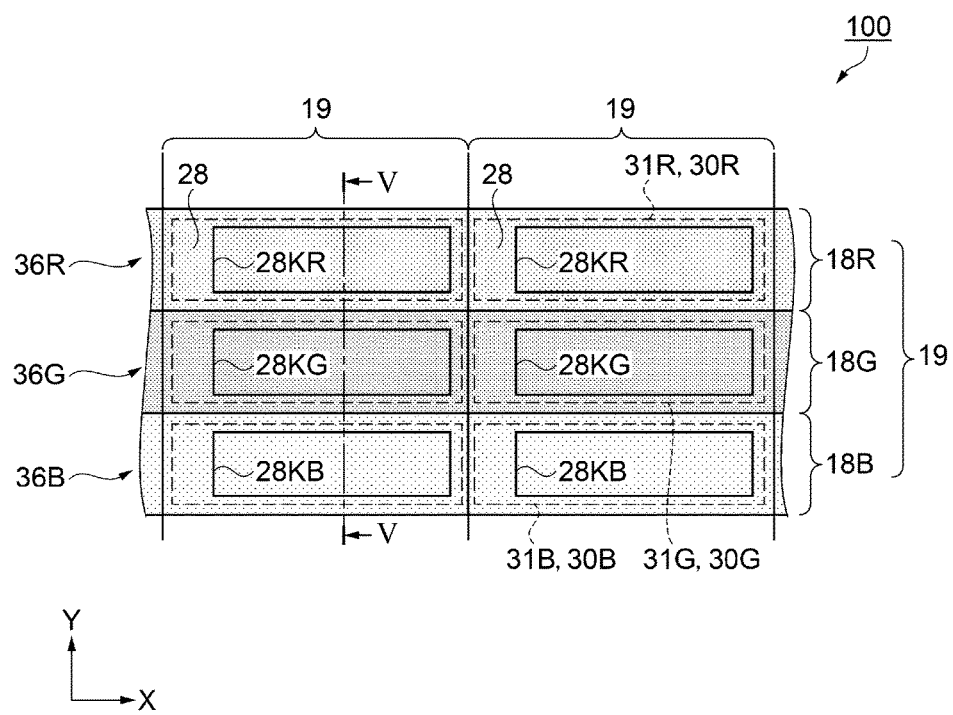
FIG. 4 is a plan view schematically illustrating arrangement of the organic EL element and a color filter in a subpixel.
Figure 5:
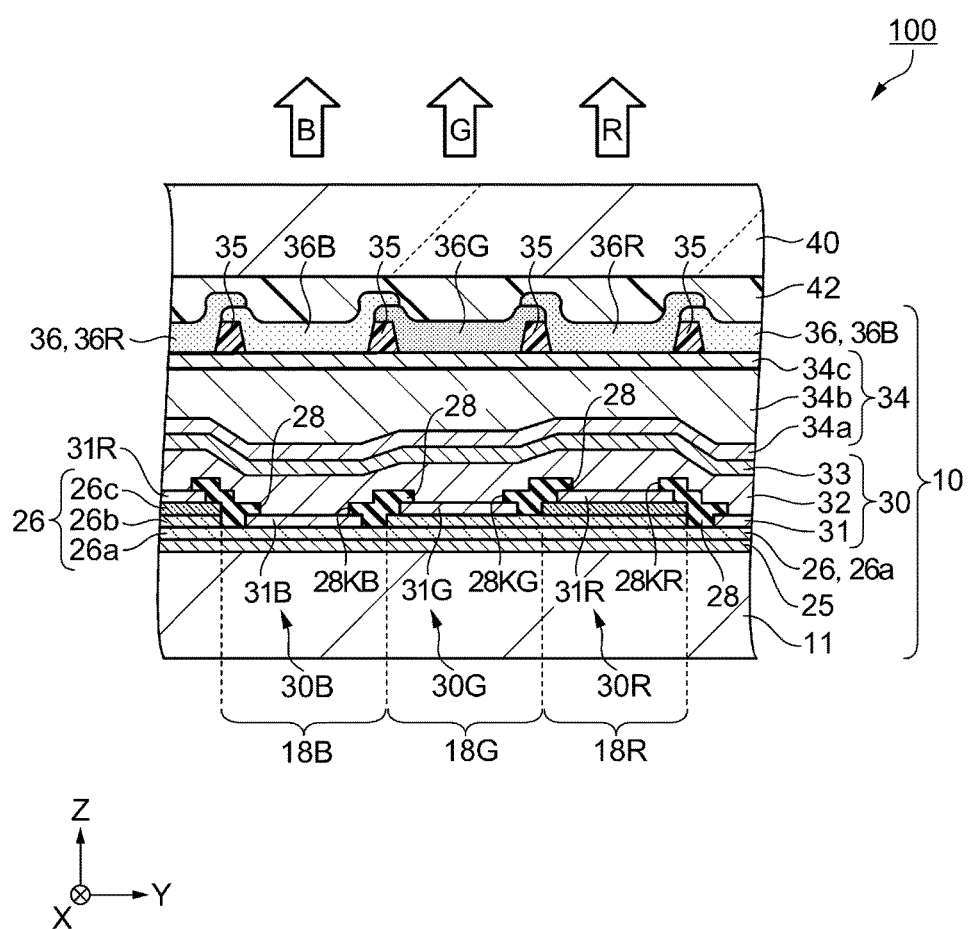
FIG. 5 is a sectional view schematically illustrating a structure of the subpixel taken along line V-V line in FIG. 4.

Next, the organic EL device 100 as the electrooptical device according to the exemplary embodiment will be described with reference to FIGS. 2 to 5. FIG. 2 is a plan view schematically illustrating the configuration of the organic EL device according to the first exemplary embodiment. FIG. 3 is an equivalent circuit diagram illustrating an electrical configuration of the organic EL device according to the first exemplary embodiment. FIG. 4 is a plan view schematically illustrating arrangement of the organic EL element and a color filter in a subpixel. FIG. 5 is a sectional view schematically illustrating a structure of the subpixel taken along line V-V in FIG. 4. The organic EL device 100 according to the exemplary embodiment is a spontaneous emission type micro-display suitable for the display unit of the above-described head mount display (HMD).

As illustrated in FIG. 2, the organic EL device 100 according to the exemplary embodiment includes an element substrate 10 and a counter substrate 40. Both the substrates are bonded to each other in a state of being disposed to face each other with an adhesive layer 42 (see FIG. 5) interposed between the substrates.

The element substrate 10 has a display area E1 as a first area and a non-display area E2 which is a peripheral area on the outside of the display area E1. A subpixel 18R emitting red (R) light, a subpixel 18G emitting green (G) light, and a subpixel 18B emitting blue (B) light are arranged in the display area E1 in a matrix manner. In the organic EL device 100, a pixel 19 including the subpixel 18R, the subpixel 18G, and the subpixel 18B is set as a display unit, and full color display is provided.

In the following descriptions, the subpixel 18R, the subpixel 18G, and the subpixel 18B may be collectively referred to as a subpixel 18. The subpixel 18 in the exemplary embodiment corresponds to a pixel in the invention. The display area E1 is an area which contributes to display by display light being emitted from the subpixel 18. The non-display area E2 on the outside of the display area E1 is covered by the case member 101 (see FIG. 1) as described above. Thus, even if display light emitted from the subpixel 18 is diffused or irregularly reflected in the non-display area E2 and thus is emitted as stray light, the stray light is blocked by the case member 101.

The element substrate 10 is larger than the counter substrate 40. A plurality of external connection terminals 102 are arranged along a first side of a portion protruding from the counter substrate 40, in the element substrate 10. A data line driving circuit 15 is provided between the plurality of external connection terminals 102 and the display area E1. A scan line driving circuit 16 is provided between the display area E1, and a second side and a third side which are orthogonal to the first side and face each other. A flexible wiring substrate (FPC) 103 for connection with an external driving circuit configured to supply a control signal, power, or the like relating to display is mounted on the external connection terminal 102.

The counter substrate 40 is smaller than the element substrate 10, and is disposed so as to cause the external connection terminals 102 to be exposed. The counter substrate 40 is a light-transmission substrate. For example, a quartz substrate, a glass substrate, or the like can be used as the counter substrate. The counter substrate 40 has a function to protect an organic EL element 30 (which will be described later) disposed in the subpixel 18 in the display area E1, so as not to be damaged. The counter substrate 40 is disposed at least to face the display area E1. A top emission type in which light emitted from the subpixel 18 is drawn from the counter substrate 40 side is employed for the organic EL device 100 in the exemplary embodiment.

In the following descriptions, a direction along the first side on which the external connection terminals 102 are arranged is set to be an X-direction, and a direction along the two sides (second side and third side) which are orthogonal to the first side and face each other is set to be a Y-direction. A direction from the element substrate 10 toward the counter substrate 40 is set to be a Z-direction. Viewing from the counter substrate 40 side in the Z-direction is referred to as "plan view".

In the exemplary embodiment, so-called a lateral stripe type arrangement of subpixels 18 is employed. In the lateral stripe type arrangement, in the display area E1, subpixels 18 in which light emission of the same color is obtained are arranged in a row direction (X-direction), and subpixels 18 in which light emission of different colors is obtained are arranged a column direction (Y-direction). The organic EL element 30 and a color filter 36 (see FIG. 4 or 5) are disposed in each of the subpixels 18. Detailed configurations of the organic EL element 30 and the color filter 36 will be described later.

FIG. 2 schematically illustrates arrangement of the subpixels 18R, 18G, and 18B in the display area E1, so as to be visually recognizable. However, the disposition of the subpixels 18 is not limited to an order of R, G, and B in the column direction (Y-direction). For example, the arrangement may be performed in an order of B, G, and R. The arrangement of the subpixels 18 is not limited to a lateral or vertical stripe type, and may be a delta type, a mosaic type, a pen tile type, the Bayer method, or an S stripe type. The shapes or the sizes of the subpixels 18R, 18G, and 18B are not limited to being the same as each other. The size of the subpixel 18B may be set to be greater than that of the subpixel 18R or 18G in accordance with visual sensitivity, and thus luminance balance can be obtained.

Electrical Configuration of Organic EL Device

As illustrated in FIG. 3, the organic EL device 100 includes a scan line 12, a data line 13, and a power line 14. The scan line 12 and the data line 13 intersect with each other. The scan line 12 is electrically connected to the scan line driving circuit 16. The data line 13 is electrically connected to the data line driving circuit 15. The subpixel 18 is provided in a region obtained by partitioning of the scan line 12 and the data line 13.

The subpixel 18 includes the organic EL element 30 and a pixel circuit 20. The pixel circuit 20 controls driving of the organic EL element 30. An organic EL element 30 disposed in the subpixel 18R is referred to as an organic EL element 30R below. An organic EL element 30 disposed in the subpixel 18G is referred to as an organic EL element 30G below. An organic EL element 30 disposed in the subpixel 18B is referred to as an organic EL element 30B below.

The organic EL element 30 includes a pixel electrode 31, a light emission function layer 32, and a counter electrode 33. The pixel electrode 31 functions as an anode configured to inject holes into the light emission function layer 32. The counter electrode 33 functions as a cathode configured to inject electrons into the light emission function layer 32. In the light emission function layer 32, an exciton (state where holes and electrons are bound to each other by the Coulomb force) is formed by the holes and the electrons which have been respectively injected, and then a portion of energy is emitted in a form of fluorescence or phosphorescence when the exciton disappears (when the holes and the electrons are recombined). In the exemplary embodiment, the light emission function layer 32 is configured so as to obtain white light emission from the light emission function layer 32.

The pixel circuit 20 includes a switching transistor 21, a storage capacity 22, and a driving transistor 23. The two transistors 21 and 23 may be configured with using n-channel or p channel transistors, for example.

The gate of the switching transistor 21 is electrically connected to the scan line 12. The source of the switching transistor 21 is electrically connected to the data line 13. The drain of the switching transistor 21 is electrically connected to the driving transistor 23.

The drain of the driving transistor 23 is electrically connected to the pixel electrode 31 of the organic EL element 30. The source of the driving transistor 23 is electrically connected to the power line 14. The storage capacity 22 is electrically connected between the gate of the driving transistor 23 and the power line 14.

If the scan line 12 is driven by a control signal supplied from the scan line driving circuit 16, and the switching transistor 21 turns into an ON state, a potential based on an image signal supplied from the data line 13 is held in the storage capacity 22 via the switching transistor 21. An ON or OFF state of the driving transistor 23 is determined in accordance with the potential of the storage capacity 22, that is, the gate potential of the driving transistor 23. If the driving transistor 23 turns into the ON state, a current of an amount depending on the gate potential flows into the organic EL element 30 from the power line 14 via the driving transistor 23. The organic EL element 30 emits light at luminance depending on the amount of the current flowing in the light emission function layer 32.

The configuration of the pixel circuit 20 is not limited to including of the two transistors 21 and 23. The pixel circuit 20 may further include a transistor for controlling a current which flows in the organic EL element 30.

Arrangement of Pixel Electrode and Color Filter

Next, the arrangement of the pixel electrode 31 and the color filter 36 of the organic EL element 30 in a subpixel 18 will be described with reference to FIG. 4.

As illustrated in FIG. 4, the pixel electrode 31 of the organic EL element 30 is disposed in each of the plurality of subpixels 18 arranged in the X-direction and the Y-direction in a matrix manner. Specifically, pixel electrodes 31R of organic EL elements 30R are respectively arranged in subpixels 18R in the X-direction. Pixel electrodes 31G of organic EL elements 30G are respectively arranged in subpixels 18G in the X-direction. Pixel electrodes 31B of organic EL elements 30B are arranged in subpixels 18B in the X-direction. Display is performed by using three subpixels 18R, 18G, and 18B which have different colors and are arranged in the Y-direction, as one pixel 19. The appearance of the pixel 19 including the three subpixels 18R, 18G, and 18B is substantially square.

Each of the pixel electrodes 31 (31R, 31G, and 31B) is substantially rectangular in plan view, and is disposed so as to cause a longitudinal direction to be directed in the X-direction. The arrangement pitch between pixels 19 in the X-direction and the Y-direction is equal to or smaller than 10 μm, for example. Thus, the width of each of the subpixels 18R, 18G, and 18B in the Y-direction is set to be from 3 μm to 4 μm.

An insulating film 28 is formed to cover an outer edge of each of the pixel electrodes 31R, 31G, and 31B. Opening portions 28KR, 28KG, and 28KB which are substantially rectangular in plan view are formed on the pixel electrodes 31R, 31G, and 31B in the insulating film 28, respectively. The pixel electrodes 31R, 31G, and 31B are exposed in the opening portions 28KR, 28KG, and 28KB, respectively. The shape of the opening portions 28KR, 28KG, and 28KB is not limited to being substantially rectangular, and may be a track-like shape in which a short side has an arc shape. The opening portion 28KR is disposed with an offset in the subpixel 18R in the X-direction. A contact portion (not illustrated) for electrical connection between the pixel electrode 31R of the organic EL element 30R and the above-described driving transistor 23 is provided at a portion obtained by the offset in the X-direction. That is, the contact portion is covered by the insulating film 28. The arrangement of the opening portions 28KG and 28KB in other subpixels 18G and 18B is similar to the above-descriptions.

The color filter 36 is disposed in the subpixels 18R, 18G, and 18B. The color filter 36 includes a coloring layer 36R of a red color (R), a coloring layer 36G of a green color (G), and a coloring layer 36B of a blue color (B). Specifically, the coloring layer 36R is disposed for a plurality of subpixels 18R arranged in the X-direction. Similarly, the coloring layer 36G is disposed for a plurality of subpixels 18G arranged in the X-direction, and the coloring layer 36B is disposed for a plurality of subpixels 18B arranged in the X-direction.

That is, the coloring layer 36R is disposed to have a stripe shape extending in the X-direction, and thus overlaps the pixel electrodes 31R (opening portions 28KR) arranged in the X-direction. The coloring layer 36G is disposed to have a stripe shape extending in the X-direction, and thus overlaps the pixel electrodes 31G (opening portions 28KG) arranged in the X-direction. Similarly, the coloring layer 36B is disposed to have a stripe shape extending in the X-direction, and thus overlaps the pixel electrodes 31B (opening portions 28KB) arranged in the X-direction.

In the exemplary embodiment, the coloring layer 36R and the coloring layer 36G are disposed at a boundary between the subpixel 18R and the subpixel 18G which are adjacent to each other in the Y-direction, so as to overlap each other. The coloring layer 36G and the coloring layer 36B are disposed at a boundary between the subpixel 18G and the subpixel 18B which are adjacent to each other in the Y-direction, so as to overlap each other. Although not illustrated, the coloring layer 36B and the coloring layer 36R are disposed at a boundary between the subpixel 18B and the subpixel 18R which are adjacent to each other in the Y-direction, so as to overlap each other.

Structure of Subpixel

Next, a structure of the subpixel 18 in the organic EL device 100 will be described with reference to FIG. 5. As illustrated in FIG. 5, the organic EL device 100 includes the element substrate 10 and the counter substrate 40 which are disposed to face each other with the adhesive layer 42 interposed between the substrates. The adhesive layer 42 has a function to adhering the element substrate 10 and the counter substrate 40 to each other. The adhesive layer 42 is formed of an epoxy resin, an acrylic resin, or the like having light transmittance.

The element substrate 10 includes a base 11 as a substrate in the invention, a reflective layer 25, a translucent layer 26, the organic EL element 30, a sealing layer 34, and the color filter 36. The reflective layer 25, the translucent layer 26, the organic EL element 30, the sealing layer 34, and the color filter 36 are stacked on the base 11 in the Z-direction in this order.

The base 11 is a semiconductor substrate formed of silicon or the like. The scan line 12, the data line 13, the power line 14, the data line driving circuit 15, the scan line driving circuit 16, the pixel circuit 20 (switching transistor 21, storage capacity 22, and driving transistor 23), and the like which are described in the equivalent circuit is formed in the base 11 by using the well-known technology. In FIG. 5, illustrations of the lines or the circuit configuration are omitted.

The base 11 is not limited to a semiconductor substrate formed of silicon or the like and may be a substrate formed of quartz, glass, or the like. In other words, the transistor constituting the pixel circuit 20 may be a MOS transistor including an active layer in a semiconductor substrate. The transistor may be a thin film transistor or a field effect transistor formed in a substrate of quartz, glass, or the like.

The reflective layer 25 is disposed across the subpixels 18R, 18G, and 18B. The reflective layer 25 reflects light emitted from the organic EL elements 30R, 30G, and 30B of the subpixels 18R, 18G, and 18B, toward the counter substrate 40 side. A material which can realize high reflectivity is used as a formation material for the reflective layer 25. Aluminum or silver, or alloys of the metals are used as the formation material.

The translucent layer 26 is provided on the reflective layer 25. The translucent layer 26 includes a first insulating film 26a, a second insulating film 26b, and a third insulating film 26c. The first insulating film 26a is disposed on the reflective layer 25 across the subpixels 18R, 18G, and 18B. The second insulating film 26b is stacked on the first insulating film 26a and is disposed across the subpixel 18R and the subpixel 18G. The third insulating film 26c is stacked on the second insulating film 26b and is disposed in the subpixel 18R.

That is, the translucent layer 26 in the subpixel 18B is configured with the first insulating film 26a. The translucent layer 26 in the subpixel 18G is configured with the first insulating film 26a and the second insulating film 26b. The translucent layer 26 in the subpixel 18R is configured with the first insulating film 26a, the second insulating film 26b, and the third insulating film 26c. Thus, the film thickness of the translucent layer 26 is increased in an order of the subpixel 18B, the subpixel 18G, and the subpixel 18R.

The organic EL element 30 is provided on the translucent layer 26. The organic EL element 30 includes the pixel electrode 31, the light emission function layer 32, and the counter electrode 33 which are stacked in the Z-direction in this order. The pixel electrode 31 is configured with a transparent conductive film such as an indium tin oxide (ITO) film. The pixel electrode 31 is formed in each subpixel 18 so as to have an island shape.

The insulating film 28 is disposed to cover the circumferential portion of each of the pixel electrodes 31R, 31G, and 31B. As described above, in the insulating film 28, the opening portion 28KR is formed on the pixel electrode 31R, the opening portion 28KG is formed on the pixel electrode 31G, and the opening portion 28KB is formed on the pixel electrode 31B. The insulating film 28 is formed of silicon oxide, for example.

At portions in which the opening portions 28KR, 28KG, and 28KB are provided, the pixel electrode 31 (31R, 31G, and 31B) and the light emission function layer 32 are in contact with each other. Thus, holes are supplied from the pixel electrode 31 to the light emission function layer 32, and electrons are supplied from the counter electrode 33, such that light is emitted in the light emission function layer 32. That is, regions in which the opening portions 28KR, 28KG, and 28KB are provided function as light emission regions in which light is emitted in the light emission function layer 32. In an area in which the insulating film 28 is provided, a supply of holes from the pixel electrode 31 to the light emission function layer 32 is suppressed and light emission of the light emission function layer 32 is suppressed.

The light emission function layer 32 is disposed across the subpixels 18R, 18G, and 18B so as to cover the entire area of the display area E1 (see FIG. 2). The light emission function layer 32 includes, for example, a hole injection layer, a hole transport layer, an organic light-emitting layer, and an electron transport layer which are stacked in the Z-direction in this order. The organic light-emitting layer emits light in a wavelength range of a wavelength of blue light to a wavelength of red light. The organic light-emitting layer may be configured with a single layer. The organic light-emitting layer may be configured with a plurality of layers which includes a blue light emitting layer, a green light emitting layer, and a red light emitting layer, or includes a blue light emitting layer and a yellow light emitting layer in which emission of light including a wavelength range of red (R) light and green (G) light is obtained.

The counter electrode 33 is disposed to cover the light emission function layer 32. A material for providing the counter electrode 33 with light transmittance and light reflectivity is used for the counter electrode 33. As such a material, alloys of magnesium and silver, and the like are used. The film thickness of the counter electrode is controlled.

The sealing layer 34 that covers the counter electrode 33 includes a first sealing layer 34a, a flattening layer 34b, and a second sealing layer 34c which are stacked in the Z-direction in this order. The first sealing layer 34a and the second sealing layer 34c are inorganic sealing layers formed by using an inorganic material. As the inorganic material, a material which is hard to pass through moisture, oxygen, or the like is used. As such a material, silicon oxide, silicon nitride, silicon oxynitride, and aluminum oxide are exemplified. Such a sealing layer 34 is formed over at the display area E1 in which at least the light emission function layer 32 (organic EL element 30) is disposed. A sealing member in the invention includes the sealing layer 34.

As a method of forming the first sealing layer 34a and the second sealing layer 34c, a vacuum deposition method, an ion plating method, a sputtering method, and a CVD method are exemplified. From a point of causing applying of damage such as heat to the organic EL element 30 to be difficult, it is desirable that the vacuum deposition method or the ion plating method is employed. The film thickness of each of the first sealing layer 34a and the second sealing layer 34c is 50 nm to 1000 nm, and preferably 200 nm to 400 nm, so as to cause cracks and the like to occur less frequently when the layer is formed, and to obtain translucency.

The flattening layer 34b is a translucent organic sealing layer. The flattening layer may be formed by using any resin of a heat or UV curable epoxy resin, an acrylic resin, a urethane resin, and a silicone resin. The flattening layer 34b is formed to be stacked on the first sealing layer 34a that covers the plurality of organic EL elements 30.

The flattening layer 34b coats defects (pin holes, cracks), impurities, and the like of the first sealing layer 34a when the first sealing layer 34a is formed and forms a substantially flat surface. An unevenness occurs on the surface of the first sealing layer 34a by an influence of the translucent layer 26 having different film thicknesses. Thus, in order to relieve the unevenness, it is preferable that the flattening layer 34b be formed to have a film thickness of 1 μm to 5 μm. Accordingly, the unevenness less influences the color filter 36 formed on the sealing layer 34. From a viewpoint of relieving the unevenness occurring by the translucent layer 26, the flattening layer 34b is preferably formed with an organic sealing layer which is easily thickened. The flattening layer 34b may be formed by using a coating type inorganic material (silicon oxide or the like).

A light-transmission convex portion 35 is provided between subpixels 18 which are adjacent to each other, on the sealing layer 34. The convex portion 35 is formed by a photolithography method with a photosensitive resin material which does not include a coloring material (color material). The convex portion 35 is disposed on the sealing layer 34 to have a stripe shape (streak shape) extending in the X-direction, and such that the coloring layers 36R, 36G, and 36B of the color filter 36 are distinguished from each other. The sectional shape of the convex portion 35 is trapezoid shape, and may be other shapes such as a rectangular shape.

The convex portion 35 is not limited to being disposed to have a stripe shape. Convex portions 35 may be arranged to extend in the X-direction and the Y-direction and to have a grid shape such that the convex portions surround the opening portions 28KB, 28KG, and 28KR in the pixel electrode 31 of the subpixel 18. It is preferable that the height of the convex portion 35 be lower (smaller) than an average film thickness of the coloring layers 36R, 36G, and 36B, which will be described later.

The color filter 36 is formed on the sealing layer 34. The color filter 36 is configured with the coloring layers 36R, 36G, and 36B which are formed by a photolithography method with a photosensitive resin material including coloring materials of a red color (R), a green color (G), and a blue color (B). That is, the main material of the convex portion 35 is the same as the main material of the coloring layers 36R, 36G, and 36B. The coloring layers 36R, 36G, and 36B are formed to correspond to the subpixels 18R, 18G, and 18B, respectively.

Each of the coloring layers 36R, 36G, and 36B is formed to fill a region between convex portions 35 which are adjacent to each other on the sealing layer 34, and to cover at least a portion of the convex portion 35. Coloring layers which are adjacent to each other among the coloring layers 36R, 36G, and 36B are formed to cause portions thereof to overlap each other.

For example, the coloring layer 36B which is adjacent to the coloring layer 36G is in contact with a side wall of a convex portion 35, and one edge portion of the coloring layer 36B overlaps the edge portion of the coloring layer 36G that covers the top portion of the convex portion 35. Similarly, the coloring layer 36R which is adjacent to the coloring layer 36G is in contact with a side wall of a convex portion 35, and one edge portion of the coloring layer 36R overlaps the edge portion of the coloring layer 36G that covers the top portion of the convex portion 35.

Although not illustrated, a method of forming the convex portion 35 and the coloring layers 36R, 36G, and 36B will be briefly described. As the method of forming the convex portion 35, a photosensitive resin material which does not include a coloring material is applied onto the sealing layer 34 by using a spin coating method and pre-baking is performed, and thereby a photosensitive resin layer is formed. The photosensitive resin material may be a positive type or a negative type. The photosensitive resin layer is exposed and developed by using the photolithography method, and thereby the convex portion 35 is formed on the sealing layer 34.

Similar to the convex portion 35, coating with a photosensitive resin material including a coloring material of the corresponding color is performed by a spin coating method, and thereby a photosensitive resin layer is formed. Then, the photosensitive resin layer is exposed and developed by using the photolithography method, and thereby the coloring layers 36R, 36G, and 36B are formed. In the exemplary embodiment, the coloring layer 36G, the coloring layer 36B, and the coloring layer 36R are formed in this order.

Thus, edge portions of the coloring layer 36G cover top portions of convex portions 35. In addition, one edge portion thereof is covered by the edge portion of the coloring layer 36B and the other edge portion is covered by the edge portion of the coloring layer 36R. One edge portion of the coloring layer 36B covers the top portion of the convex portion 35 and is covered by the edge portion of the coloring layer 36R. The other edge portion thereof covers the edge portion of the coloring layer 36G. One edge portion of the coloring layer 36R covers the edge portion of the coloring layer 36G, and the other edge portion thereof covers the edge portion of the coloring layer 36B. That is, since the convex portion 35 can be formed in a process of forming the color filter 36, a forming process of the color filter 36 (which will be described later) will be described with including the process of forming the convex portion 35.

Optical Resonance Structure

Light having amplified intensity as display light is emitted from the counter substrate 40 in the Z-direction. In the organic EL device 100, while light emitted from the light emission function layer 32 is repeatedly reflected between the reflective layer 25 and the counter electrode 33, intensity of light having a specific wavelength (resonance wavelength) corresponding to an optical distance between the reflective layer 25 and the counter electrode 33 is amplified. Light having amplified intensity as display light is emitted from the counter substrate 40 in the Z-direction.

In the exemplary embodiment, the translucent layer 26 has a function to adjust the optical distance between the reflective layer 25 and the counter electrode 33. As described above, the film thickness of the translucent layer 26 is increased in an order of the subpixel 18B, the subpixel 18G, and the subpixel 18R. As a result, the optical distance between the reflective layer 25 and the counter electrode 33 is increased in an order of the subpixel 18B, the subpixel 18G, and the subpixel 18R. The optical distance can be represented by the sum of products of the refractive index and the film thickness of each of layers provided between the reflective layer 25 and the counter electrode 33.

For example, in the subpixel 18B, the film thickness of the translucent layer 26 is set to cause the resonance wavelength (peak wavelength at which luminance is highest) to be 470 nm. In the subpixel 18G, the film thickness of the translucent layer 26 is set to cause the resonance wavelength to be 540 nm. In the subpixel 18R, the film thickness of the translucent layer 26 is set to cause the resonance wavelength to be 610 nm.

As a result, blue light (B) having a peak wavelength of 470 nm is emitted from the subpixel 18B, green light (G) having a peak wavelength of 540 nm is emitted from the subpixel 18G, and red light (R) having a peak wavelength of 610 nm is emitted from the subpixel 18R. In other words, the organic EL device 100 has an optical resonance structure of amplifying intensity of light having a specific wavelength. Thus, in the subpixel 18B, a light component of the blue color is extracted from white light emitted from the light emission function layer 32. In the subpixel 18G, a light component of the green color is extracted from white light emitted from the light emission function layer 32. In the subpixel 18R, a light component of the red color is extracted from white light emitted from the light emission function layer 32.

Instead of the translucent layer 26, the film thicknesses of the pixel electrodes 31 (31R, 31G, and 31B) may be caused to be different from each other, and thus the optical distance between the reflective layer 25 and the counter electrode 33 may be adjusted.

In such subpixels 18R, 18G, and 18B, the color filter 36 is disposed on the sealing layer 34. The coloring layer 36B is disposed on the organic EL element 30B of the subpixel 18B, with the sealing layer 34 interposed between the coloring layer 36B and the organic EL element 30B. Thus, color purity is improved by transmitting blue light (B) having a peak wavelength of 470 nm through the coloring layer 36B. Similarly, the coloring layer 36G is disposed on the organic EL element 30G of the subpixel 18G with the sealing layer 34 interposed between the coloring layer 36G and the organic EL element 30G, and the coloring layer 36R is disposed on the organic EL element 30R of the subpixel 18R with the sealing layer 34 interposed between the coloring layer 36R and the organic EL element 30R. Accordingly, color purity is improved by transmitting green light (G) having a peak wavelength of 540 nm through the coloring layer 36G, and color purity is improved by transmitting red light (R) having a peak wavelength of 610 nm through the coloring layer 36R.

As described above, light emitted from the subpixel 18 is light emitted from the counter electrode 33 toward the sealing layer 34 side, and has a spectrum which is different from the spectrum of light emitted in the light emission function layer 32 of the organic EL element 30.

Meanwhile, each of the coloring layers 36R, 36G, and 36B causes only light having a specific wavelength range to be transmitted therethrough, and absorbs light having a wavelength which is out of the specific wavelength range. Thus, regarding light transmitted through the convex portion 35 having the top portion which is covered by coloring layers of different colors, light corresponding to a portion or the entirety of the wavelength range is absorbed by the coloring layers of the different colors. Thus, luminance is decreased. That is, at a boundary portion between subpixels 18 which are adjacent to each other, at which emission of light having different colors is obtained, luminance is decreased by transmitting red light (R) through the coloring layer 36G or the coloring layer 36B, luminance is decreased by transmitting green light (G) through the coloring layer 36B or the coloring layer 36R, and luminance is decreased by transmitting blue light (B) through the coloring layer 36R or the coloring layer 36G.

In other words, light which is emitted from the organic EL element 30R of the subpixel 18R in an inclined direction, is transmitted through the coloring layer 36R of the red color, and is incident into the coloring layer 36B of the blue color or the coloring layer 36G of the green color is blocked. Similarly, light which is emitted from the organic EL element 30G of the subpixel 18G in an inclined direction, is transmitted through the coloring layer 36G of the green color, and is incident into the coloring layer 36B of the blue color or the coloring layer 36R of the red color is blocked. Light which is emitted from the organic EL element 30B of the subpixel 18B in an inclined direction, is transmitted through the coloring layer 36B of the blue color, and is incident into the coloring layer 36G of the green color or the coloring layer 36R of the red color is blocked. Thus, a direction of light extracted from the organic EL device 100 is defined based on the position of each of the organic EL elements 30 and the position of each of the coloring layers in the color filter 36.

In the organic EL device 100, in order to improve color purity of light emitted from each of the subpixels 18R, 18G, and 18B and to obtain favorable viewing angle characteristics, it is necessary that precision of dimensions, the position, and the like of each of the coloring layers 36R, 36G, and 36B constituting the color filter 36 is improved. Descriptions of the convex portion 35 to distinguish the coloring layers 36R, 36G, and 36B from each other are similar to the above descriptions. In particular, in the exemplary embodiment, the convex portion 35 and the coloring layers 36R, 36G, and 36B are formed to have a stripe shape extending in the X-direction. Thus, in the subpixel 18, it is necessary that relative formation precision of the convex portion 35 and the coloring layers 36R, 36G, and 36B with respect to the organic EL element 30 in the Y-direction rather than the X-direction is improved. Accordingly, the organic EL device 100 according to the exemplary embodiment includes an evaluation pattern for evaluating management characteristics such as dimensions and the position of the convex portion 35 and the color filter 36. Since the dimensions, the position, and the like of the evaluation pattern are measured, the formation precision of the convex portion 35 and the color filter 36 are managed. The evaluation pattern will be described below. As described above, since the process of forming the convex portion 35 is included in the process of forming the color filter 36. Thus, the color filter 36 will be described below with including the convex portion 35.

Evaluation Pattern

Figure 6:
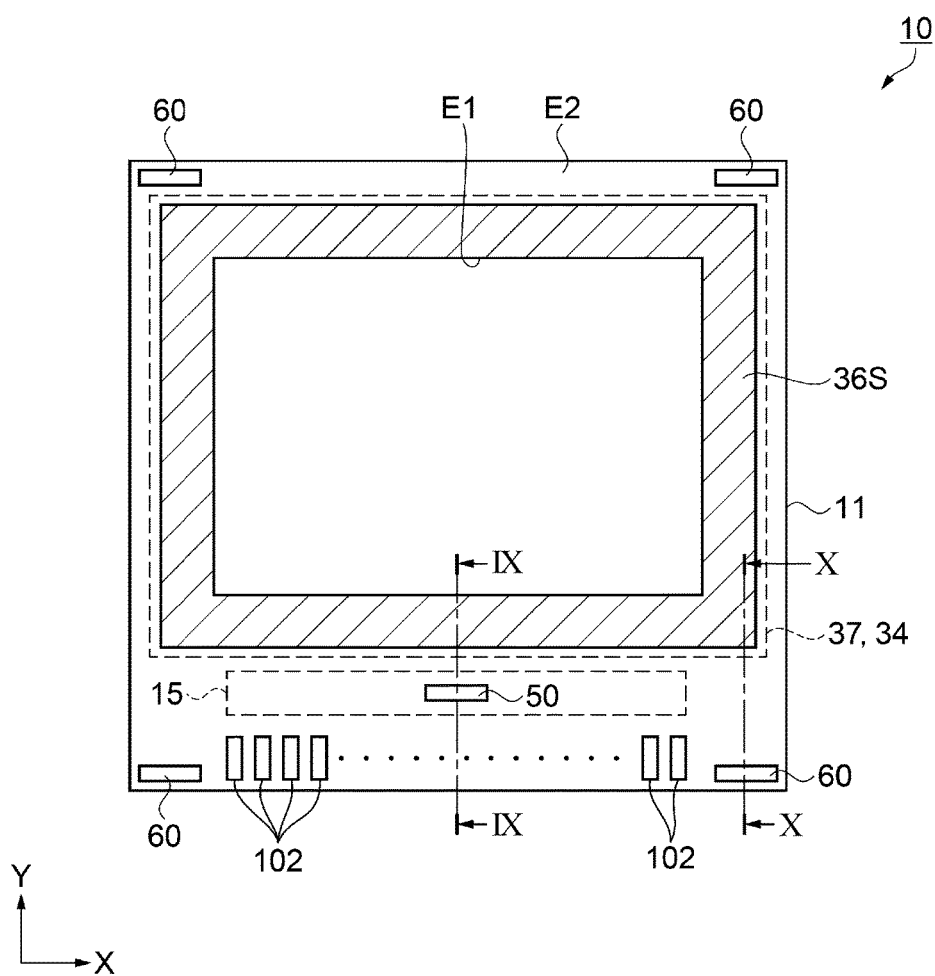
FIG. 6 is a plan view schematically illustrating an example of arrangement of an evaluation pattern in an element substrate.
Figure 7:
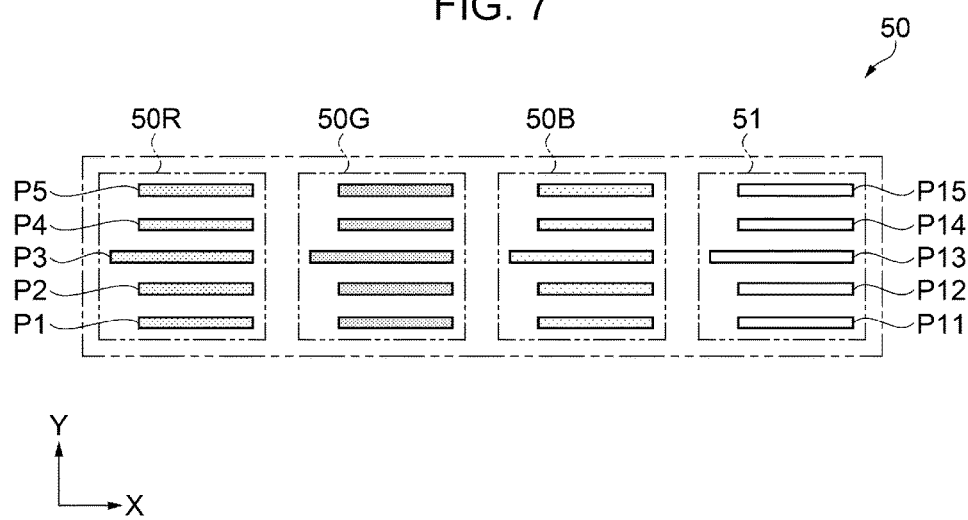
FIG. 7 is a plan view schematically illustrating an arrangement example of the color pattern in a dimension evaluation pattern.
Figure 8:
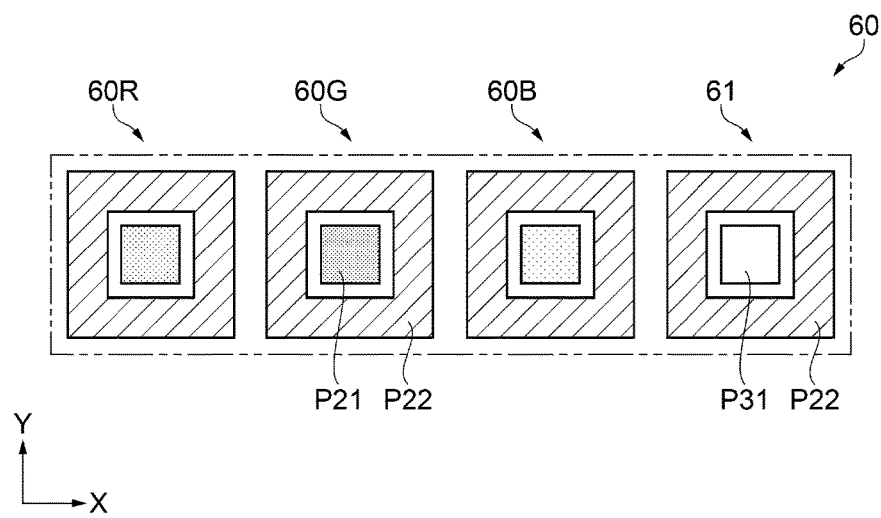
FIG. 8 is a plan view schematically illustrating an arrangement example of the color pattern in a position evaluation pattern.

Firstly, an outline of the evaluation pattern for evaluating the color filter 36 in the exemplary embodiment will be described with reference to FIGS. 6 to 8. FIG. 6 is a plan view schematically illustrating an example of arrangement of evaluation patterns in the element substrate. FIG. 7 is a plan view schematically illustrating an arrangement example of the color patterns in a dimension evaluation pattern. FIG. 8 is a plan view schematically illustrating an arrangement example of the color patterns in a position evaluation pattern.

As illustrated in FIG. 6, in the organic EL device 100 in the exemplary embodiment, a dimension evaluation pattern 50 and a position evaluation pattern 60 as the evaluation pattern for evaluating the color filter 36 are provided on the element substrate 10. All the dimension evaluation pattern 50 and the position evaluation pattern 60 are provided in the non-display area E2 on the outside of the display area E1. A color-filter light shielding member 36S (simplified and described as a CF light shielding member 36S below) is provided in the non-display area E2 so as to surround the display area E1. The configuration of the CF light shielding member 36S will be described later. The CF light shielding member 36S has a configuration of imparting a light blocking property by piling up the coloring layers 36R, 36G, and 36B of the three colors. The above-described sealing layer 34 is provided to overlap not only the display area E1 but also the CF light shielding member 36S in plan view. In the exemplary embodiment, the dimension evaluation pattern 50 and the position evaluation pattern 60 are disposed between an outer circumferential end portion of the element substrate 10 and the end portion of a sealing member 37 including the sealing layer 34.

The dimension evaluation pattern 50 is disposed on the substantially center portion side in the X-direction between the CF light shielding member 36S and the external connection terminal 102 in the Y-direction. In plan view, the dimension evaluation pattern 50 is disposed to overlap the data line driving circuit 15 extending in the X-direction, on the outer side of the CF light shielding member 36S.

The dimension evaluation pattern 50 has a function as a so-called test element group (TEG), and is provided for evaluating dimension precision of each of the coloring layers 36R, 36G, and 36B in the color filter 36 and the convex portion 35. The dimension precision referring herein includes management characteristics such as dimensions (width), the shape, and the film thickness of each of the coloring layers 36R, 36G, and 36B and the convex portion 35.

Specifically, as illustrated in FIG. 7, the dimension evaluation pattern 50 includes a pattern group 50R, a pattern group 50G, a pattern group 50B, and a pattern group 51 as the color pattern provided for each color. Each of the pattern groups 50R, 50G, and 50B includes a plurality of patterns P1, P2, P3, P4, and P5 formed of a photosensitive resin material which is the same as that of each of the coloring layers 36R, 36G, and 36B of the colors in the color filter 36. The pattern group 51 includes a plurality of patterns P11, P12, P13, P14, and P15 formed of a photosensitive resin material which does not include a color material which is the same as that of the convex portion 35.

Similar to the coloring layers 36R, 36G, and 36B, each of the patterns P1, P2, P3, P4, and P5 is formed to have a stripe shape extending in the X-direction. Patterns which are adjacent to each other in the Y-direction are formed to be spaced from each other. That is, the convex portion 35 is not disposed between the patterns which are adjacent to each other. This point is different from the coloring layers 36R, 36G, and 36B of the color filter 36, which are formed to cause portions (edge portions) thereof to overlap each other on the convex portion 35.

The coloring layers 36R, 36G, and 36B are formed to cause edge portions of the coloring layers which are adjacent to each other to overlap each other on the convex portion 35. Thus, in the manufacturing process of the color filter 36, it is difficult to accurately measure dimensions (width), the shape, the film thickness, and the like of each of the coloring layers 36R, 36G, and 36B or the convex portion 35.

The pattern groups 50R, 50G, 50B, and 51 constituting the dimension evaluation pattern 50 are formed with the same materials and the same manufacturing process as those of the coloring layers 36R, 36G, and 36B or the convex portion 35, in the manufacturing process of the color filter 36.

Thus, if the dimension evaluation pattern 50 is measured, it is possible to obtain information regarding management characteristics such as dimensions, the shape, and the film thickness of each of the coloring layers 36R, 36G, and 36B and the convex portion 35. The width of each of the patterns P1, P2, P3, P4, and P5 in the Y-direction is within twice the width of each of the coloring layers 36R, 36G, and 36B. It is preferable that the width thereof be equal to the width of each of the coloring layers 36R, 36G, and 36B. Similarly, the width of each of the patterns P11, P12, P13, P14, and P15 of the pattern group 51 formed with the same material and the same manufacturing process as those of the convex portion 35 is within twice the width of the convex portion 35 in the Y-direction. It is preferable that the width thereof be equal to the width of the convex portion 35.

The pattern P3 which is disposed at the center in the Y-direction among the patterns P1, P2, P3, P4, and P5 is a pattern set as a measurement target. If only one pattern corresponding to each of the coloring layers 36R, 36G, and 36B is provided to be isolated, over exposing or over developing may easily be performed when the pattern is formed by a photolithography method. Thus, the shape of the pattern may be collapsed (deform) or may disappears. Therefore, if the plurality of patterns P1, P2, P3, P4, and P5 are provided and the pattern P3 set as the measurement target is disposed between the patterns P1 and P2 and the patterns P4 and P5, over exposing or over developing is prevented and an occurrence of a situation in which the pattern P3 deforms or disappears is suppressed.

The pattern P3 among the patterns P1, P2, P3, P4, and P5 is different from the patterns P1, P2, P4, and P5 disposed on both sides of the pattern P3. More specifically, the length of the pattern P3 in the X-direction is longer than the lengths of the patterns P1, P2, P4, and P5 disposed on both of the sides of the pattern P3. Thus, it is possible to easily recognize the pattern P3 set as the measurement target, from the pattern P1, P2, P3, P4, and P5. The above descriptions are similarly applied to the patterns P11, P12, P13, P14, and P15 relating to the convex portion 35. The length of the pattern P13 as the measurement target, which is disposed at the center in the Y-direction, in the X-direction is longer than the lengths of other patterns P11, P12, P14, and P15.

Similarly to the dimension evaluation pattern 50, the position evaluation pattern 60 has a function as a so-called test element group (TEG), and is provided for evaluating position precision of each of the coloring layers 36R, 36G, and 36B in the color filter 36 and the convex portion 35 on the element substrate 10. The position precision referring herein includes management characteristics such as position shift (for example, shift in a specific direction), rotation, deviation in magnification, and distortion of the each of the coloring layers 36R, 36G, and 36B and the convex portion 35, for example.

As illustrated in FIG. 6, the position evaluation pattern 60 is disposed on the outside of the CF light shielding member 36S in the non-display area E2 of the element substrate 10, and at the corner of the element substrate 10. FIG. 6 illustrates a state where the position evaluation pattern 60 is disposed at all corners of the element substrate 10. However, the position evaluation pattern 60 may be provided at least one place among the four corners.

As illustrated in FIG. 8, the position evaluation pattern 60 includes a pattern group 60R, a pattern group 60G, a pattern group 60B, and a pattern group 61. The pattern group 60R, the pattern group 60G, and the pattern group 60B correspond to the coloring layers 36R, 36G, and 36B of the three colors, respectively. The pattern group 61 corresponds to the convex portion 35. Each of the pattern groups 60R, 60G, and 60B includes a pattern P21 and a pattern P22. The pattern P21 is formed to be a substantially rectangle. The pattern P22 is formed to have a frame-like shape and to surround the pattern P21. The pattern P21 is formed to be spaced from the pattern P22 in the X-direction and the Y-direction, in an opening portion of the pattern P22. Similarly, the pattern group 61 includes a pattern P31 and the pattern P22. The pattern P31 is formed to be rectangular. The pattern P22 is formed to have a frame-like shape and to surround the pattern P31. The pattern P31 is formed to be spaced from the pattern P22 in the X-direction and the Y-direction, in an opening portion of the pattern P22.

Patterns P21 of the pattern groups 60R, 60G, and 60B are formed with photosensitive resin materials including color materials which are the same as those of the coloring layers 36R, 36G, and 36B in the color filter 36, respectively. The pattern P31 of the pattern group 61 is formed with a photosensitive resin material which does not include a color material, similarly to the convex portion 35. The patterns P21 of the pattern groups 60R, 60G, and 60B and the pattern P31 of the pattern group 61 are formed in the manufacturing process of the color filter 36.

The pattern P22 of each of the pattern groups 60R, 60G, 60B, and 61 is formed with amorphous silicon, polycrystalline silicon, a metal material, silicon nitride, or the like. The pattern P22 of each of the pattern groups 60R, 60G, 60B, and 61 is formed in a process before the color filter 36 is manufactured.

The pattern groups 60R, 60G, 60B, and 61 are designed to cause a predetermined space to be provided between an inner end of the opening portion of the pattern P22 and outer circumferences of the patterns P21 or the pattern P31. Thus, the space (distance) between the inner end of the opening portion of the pattern P22 and outer circumferences of the patterns P21 or the pattern P31 is measured and the measured distance is compared to a designed value. Accordingly, it is understood whether or not the position of the pattern P21 or the pattern P31 is shifted from the pattern P22. In a case where the position is shifted, the degree of the shifted position and the position-shifted direction are understood. Thus, it is possible to obtain information regarding the position of each of the coloring layers 36R, 36G, and 36B in the color filter 36 and the convex portion 35, on the base 11.

Arrangement of Evaluation Pattern on Base

Figure 9:
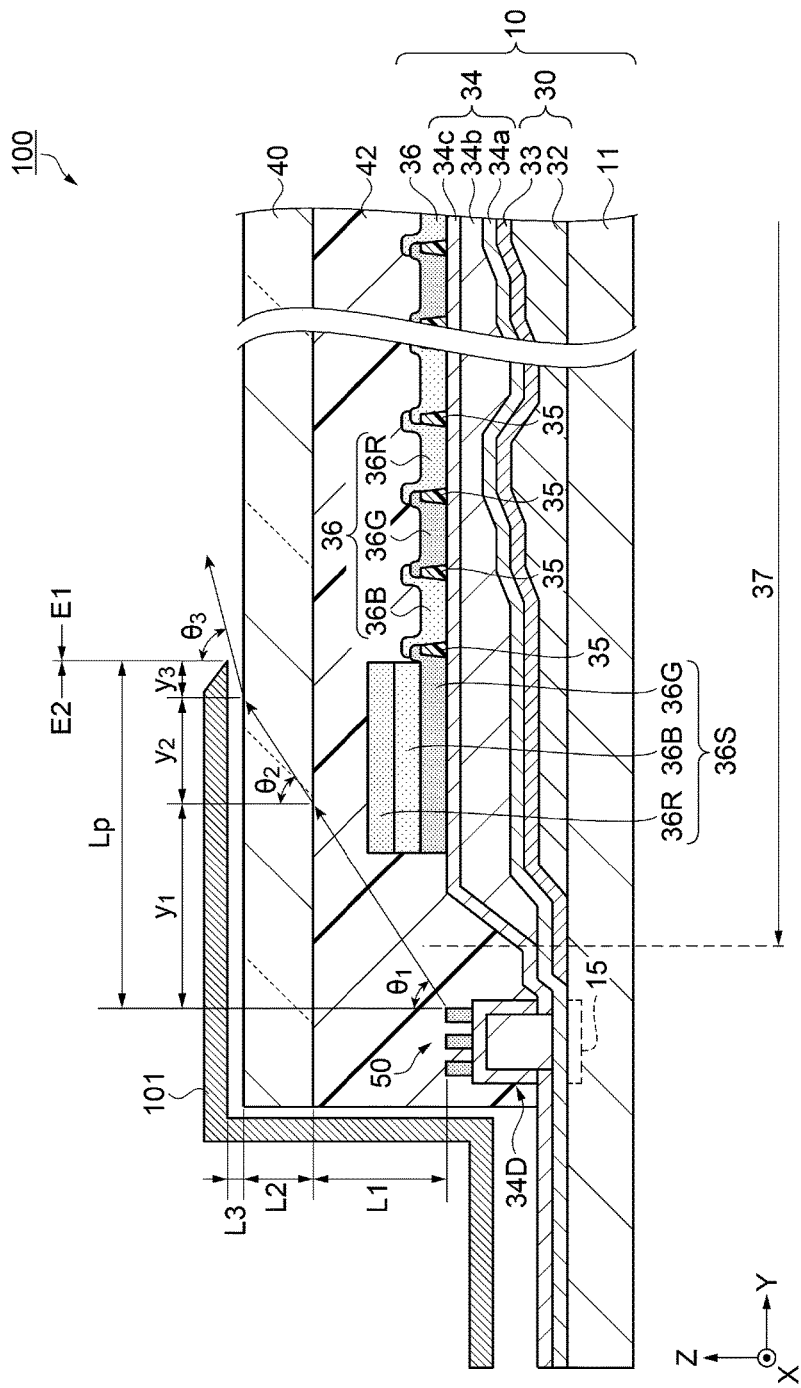
FIG. 9 is a sectional view schematically illustrating a structure of the organic EL device taken along line IX-IX in FIG. 6.
Figure 10:
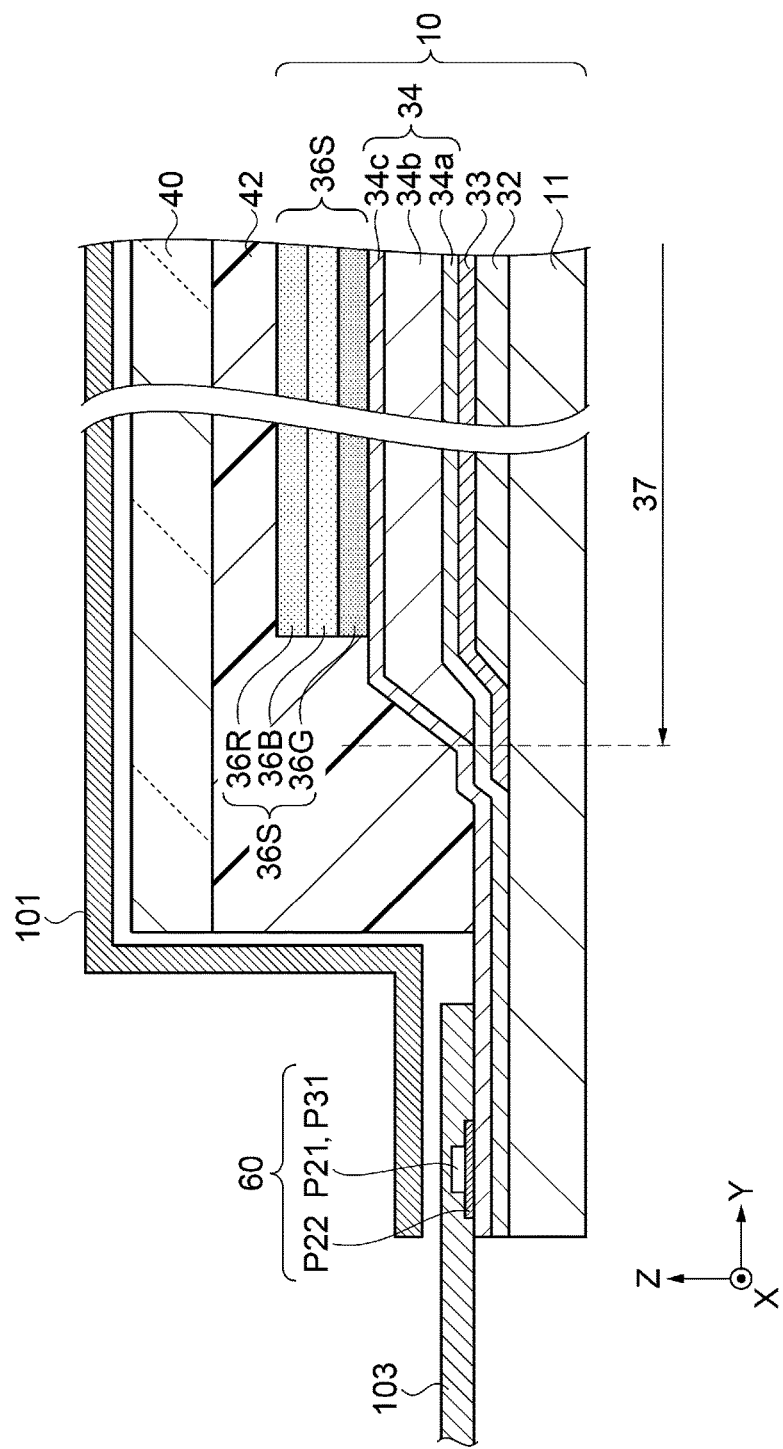
FIG. 10 is a sectional view schematically illustrating the structure of the organic EL device taken along line X-X in FIG. 6.

Next, structures of the dimension evaluation pattern 50 and the position evaluation pattern 60 on the base 11 will be described with reference to FIGS. 9 and 10, respectively. FIG. 9 is a sectional view schematically illustrating a structure of the organic EL device taken along line IX-IX in FIG. 6. FIG. 10 is a sectional view schematically illustrating the structure of the organic EL device taken along line X-X in FIG. 6.

As described above, the dimension evaluation pattern 50 includes pattern groups 50R, 50G, 50B, and 51. Each of the pattern groups 50R, 50G, 50B, and 51 is configured with a plurality of patterns which are separated from each other. Thus, if light emitted from the organic EL element 30 disposed in the display area E1 is incident to the pattern groups 50R, 50G, 50B, and 51, incident light is transmitted through the pattern groups. In particular, the plurality of patterns are arranged to be spaced from each other in the Y-direction. Thus, the incident light may be diffracted by the plurality of patterns, and a portion of the diffracted light may serve as stray light which is incident to the display area E1. Therefore, it is preferable that the dimension evaluation pattern 50 be disposed on the outside of the CF light shielding member 36S provided in the non-display area E2, so as not to disturb display light emitted from the display area E1. In this state, it is necessary that the dimension evaluation pattern 50 be disposed to conduct a function as the dimension evaluation pattern 50.

Specifically, as illustrated in FIG. 9, the organic EL device 100 includes the element substrate 10 and the counter substrate 40 which are disposed to face each other with the adhesive layer 42 interposed between the substrates. In the element substrate 10, the sealing member 37 including the sealing layer 34 that seals the organic EL element 30 disposed in the display area E1 is formed to cause the end portion thereof to protrude toward the non-display area E2. The termination of the flattening layer 34b is configured by an inclined surface, at the end portion of the sealing member 37. A region from the vicinity of a portion at which the flattening layer 34b is cut off to a portion at which the first sealing layer 34a and the second sealing layer 34c are piled is a region of the sealing member 37.

A plurality of convex portions 35 are formed on the sealing layer 34 that covers the display area E1, so as to be spaced from each other in the Y-direction. Each of the coloring layers 36R, 36G, and 36B is disposed between convex portions 35 which are adjacent to each other in the Y-direction. The CF light shielding member 36S is formed at a portion at which the sealing layer 34 protrudes toward the non-display area E2. The CF light shielding member 36S is configured with the coloring layers 36G, 36B, and 36R which are stacked in this order from the sealing layer 34 side. The order of stacking depends on an order of forming the coloring layers 36G, 36B, and 36R.

In the exemplary embodiment, the dimension evaluation pattern 50 is disposed on a pedestal member 34D which is provided on the base 11. The pedestal member 34D is provided between the end portion of the base 11 and the end portion of the sealing member 37. The structure of the pedestal member 34D on the base 11 is the same as that of the sealing layer 34. The pedestal member 34D is configured with the first sealing layer 34a, the flattening layer 34b, and the second sealing layer 34c. That is, the height of the pedestal member 34D on the base 11 is equal to the height of the sealing member 37 including the sealing layer 34. In FIG. 9, the dimension evaluation pattern 50 on the pedestal member 34D is illustrated to include three patterns. However, in practice, as illustrated in FIG. 7, the dimension evaluation pattern 50 includes the patterns P1 to P5 and the patterns P11 to P15.

The frame-like case member 101 is disposed to surround the display area E1 on a side of the counter substrate 40 from which light is emitted. The case member 101 is disposed so as to cause side surfaces of the counter substrate 40 and the adhesive layer 42 to face a portion of the element substrate 10, which protrudes from the counter substrate 40 in the Y-direction. An opening portion which is slightly larger than the size of the display area E1 is formed in the case member 101 in consideration of position precision when the case member 101 is mounted to the counter substrate 40. Although not illustrated in FIG. 9, a gap between the portion of the element substrate 10, which protrudes from the counter substrate 40 in the Y-direction, and the case member 101 is filled with, for example, a molding material such as a silicone resin, and sealed, in order to prevent permeation of moisture and the like from the outside.

The organic EL element 30 disposed in the display area E1 is a surface light source. Light which is transmitted through the color filter 36, is emitted from the counter substrate 40 side, and then is transmitted through the opening portion of the case member 101 is display light. Light which is emitted from the organic EL element 30 and is incident to the CF light shielding member 36S is absorbed by the CF light shielding member 36S, and thus the intensity thereof is attenuated or the light is blocked. Light which is emitted from the organic EL element 30 and is leaked from the end portion of the sealing member 37 is diffused or irregularly reflected between the element substrate 10 and the counter substrate 40 in the non-display area E2, and thus serves as stray light.

Since the dimension evaluation pattern 50 is provided on the pedestal member 34D in the non-display area E2, stray light which is transmitted through the end portion of the dimension evaluation pattern 50 on the display area E1 side may be transmitted through the adhesive layer 42 and the counter substrate 40, and may be mixed with display light emitted from the display area E1.

Even though the stray light is mixed with the display light emitted from the display area E1, whether or not the mixed light influences the real display in the above-described HMD 1000 depends on condensing capability of the condensing optical system 1002 disposed to face the organic EL device 100. Generally, the condensing capability of the condensing optical system 1002 is determined based on the number of apertures. The condensing capability can be indicated by an angle of incident light which can be condensed by the condensing optical system 1002, to an optical axis. In this specification, the angle is set as an uptake angle θg at which the condensing optical system 1002 can swallow light emitted from the organic EL device 100.

As illustrated in FIG. 9, if stray light which is transmitted through the adhesive layer 42 at an angle $\theta_1$ to the normal line of the end portion of the dimension evaluation pattern 50 on the display area E1 side is incident to the counter substrate 40 having a refractive index which is different from the adhesive layer 42, the stray light is transmitted through the counter substrate 40 at an angle $\theta_2$ to the normal line of an incident position of the counter substrate 40. The stray light which is transmitted through the counter substrate 40 at the angle $\theta_2$ is incident to an air layer having a refractive index which is smaller than that of the counter substrate 40. Thus, the stray light is emitted from the counter substrate 40 at an angle $\theta_3$ which is smaller than the angle $\theta_2$. In a case where the stray light emitted from the counter substrate 40 at the angle $\theta_3$ is incident to the case member 101, the light is blocked by the case member 101. However, in a case where the stray light is leaked from the end portion of the opening portion of the case member 101 on the display area E1 side, the stray light is mixed with display light. The position of the end portion of the opening portion in the case member 101 is not necessarily the same as the position of the end portion of the display area E1.

The inventor assumed that the dimension evaluation pattern 50 was disposed at a position satisfying Expression (1).

$$Lp > \Sigma(Ln \times \tan \theta_n) \tag{1}$$

n indicates an integer of 1 or more. Lp indicates a distance from the end portion of the case member 101 as the light shielding member, on the display area E1 side, to the end portion of the dimension evaluation pattern 50 in plan view. Ln indicates the thickness of each of the translucent members of n layers disposed between the dimension evaluation pattern 50 and the case member 101, on the dimension evaluation pattern 50. $\theta_n$ indicates an angle of light to the normal line of each of the translucent members when the light emitted in a direction inclined from the normal line of the end portion of the dimension evaluation pattern 50 is transmitted to the corresponding translucent member.

In the exemplary embodiment, the translucent members of n layers disposed between the dimension evaluation pattern 50 and the case member 101 are the adhesive layer 42, the counter substrate 40, and the air layer. Thus, if Expression (1) is applied to the exemplary embodiment, Expression (2) is obtained.

$$Lp > L1 \times \tan\theta_1 + L2 \times \tan\theta_2 + L3 \times \tan\theta_3 \quad (2)$$

In this case, L1 indicates the thickness of the adhesive layer 42 between the dimension evaluation pattern 50 and the counter substrate 40 in the Z-direction. L2 indicates the thickness of the counter substrate 40. L3 indicates the length of the gap between the counter substrate 40 and the case member 101 in the Z-direction.

If the refractive index of the adhesive layer 42 is set as n1, the refractive index of the counter substrate 40 is set as n2, and the refractive index of the air layer is set as n3, Expression (2) can be converted into Expression (3).

$$L1 \times \tan\theta_1 + L2 \times \tan\left\{\arcsin\left(\frac{n1}{n2}\sin\theta_1\right)\right\} + \\ L3 \times \tan\left(\arcsin\left\{\frac{n2}{n3}\sin\left(\arcsin\left(\frac{n1}{n2}\sin\theta_1\right)\right)\right\}\right) \quad (3)$$

That is, the angle $\theta_2$ of light which is incident from the adhesive layer 42 and then is transmitted through the counter substrate 40 can be defined by the refractive index n1 of the adhesive layer 42, the refractive index n2 of the counter substrate 40, and the angle $\theta_1$ of the light which is incident to the counter substrate 40. In the similar manner, the angle $\theta_3$ of light which is incident from the counter substrate 40 and then is transmitted through the air layer can be defined by the refractive index n2 of the counter substrate 40, the refractive index n3 of the air layer, and the angle $\theta_2$ of the light which is incident to the air layer. That is, the distance Lp can be defined by the thicknesses L1, L2, and L3 of the translucent members and the angle $\theta_1$.

Thus, according to FIG. 9, since L1×tan $\theta_1$=$y_1$, L2×tan $\theta_2$=$y_2$, and L3×tan $\theta_3$=$y_3$ are satisfied, Lp>$y_1$+$y_2$+$y_3$ is obtained. $y_1$ indicates a distance from the end portion of the dimension evaluation pattern 50 in the Y-direction to a first incident position when stray light of the angle $\theta_1$ is transmitted through the adhesive layer 42 and then is incident to the counter substrate 40. $y_2$ indicates a distance from the first incident position in the Y-direction to a second incident position when the stray light which has been transmitted at the angle $\theta_2$ through the counter substrate 40 is incident to the air layer. $y_3$ indicates a distance from the second incident position in the Y-direction to the end portion of the case member 101.

If the stray light which has been transmitted at the angle $\theta_3$ through the air layer is leaked from the end portion of the case member 101 on the display area E1 side, the stray light comes to be mixed with display light. In practice, as described above, if the angle $\theta_3$ is equal to or smaller than the uptake angle $\theta g$ of the condensing optical system 1002, the stray light influences display. Thus, if the angle $\theta_1$ is inversely calculated based on the angle $\theta_3$ obtained from the uptake angle $\theta g$ of the condensing optical system 1002, it is possible to derive the shortest distance from the end portion of the case member 101 on the base 11 in a case where the dimension evaluation pattern 50 is provided. If the distance Lp is longer than the shortest distance, it is possible to actually avoid an influence of light leakage occurring by providing the dimension evaluation pattern 50 on the base 11.

For example, it is assumed that the thickness L1 of the adhesive layer 42 is 5 µm, the refractive index n1 is 1.5, the thickness L2 of the counter substrate 40 is 1150 µm, (1.15 mm), the refractive index n2 is 1.46, the thickness L3 of the air layer is 15 µm, and the refractive index n3 is 1. The angle $\theta_3$ obtained from the uptake angle $\theta g$ of the condensing optical system 1002 is set to 12 degrees, and the angle $\theta_2$ and the angle $\theta_1$ are inversely calculated. The angle $\theta_2$ is about 8.19 degrees, and the angle $\theta_1$ is about 7.97 degrees. If the obtained angles are applied to Expression (3) and calculation is performed, $y_1$ is obtained to be 1 µm, $y_2$ is obtained to be 165 µm, $y_3$ is obtained to be 3 µm, and the shortest distance is obtained to be 169 µm. That is, in order to prevent light leakage of stray light occurring by providing the dimension evaluation pattern 50, it is preferable that the distance Lp from the end portion of the case member 101 on the display area E1 side to the end portion of the dimension evaluation pattern 50 in the Y-direction be set to be longer than 169 µm. Thus, it is possible to specify the position of the pedestal member 34D and the positions of the plurality of patterns in the dimension evaluation pattern 50.

From a viewpoint of preventing reflection of stray light at an interface between the adhesive layer 42 and the counter substrate 40 in the non-display area E2, it is preferable that materials thereof be selected so as to cause a difference between the refractive index n1 of the adhesive layer 42 and the refractive index n2 of the counter substrate 40 to be small. The thickness L1 of the adhesive layer 42 or the thickness L3 of the air layer in the gap between the counter substrate 40 and the case member 101 is in a µm unit, but the thickness L2 of the counter substrate 40 is in a mm unit. Thus, it may be considered that the shortest distance is substantially determined by the thickness L2 of the counter substrate 40. That is, the distance Lp from the end portion of the case member 101 on the display area E1 side to the end portion of the dimension evaluation pattern 50 on the base 11 may be obtained considering the uptake angle $\theta g$ of the condensing optical system 1002 and the thickness L2 of the counter substrate 40.

As illustrated in FIG. 6, the position evaluation pattern 60 is provided at the corner of the base 11. As illustrated in FIG. 10, in a case where the position evaluation pattern 60 is provided at the corner of the base 11, which protrudes from the counter substrate 40, considering light leakage occurring by the dimension evaluation pattern 50 is not required.

As illustrated in FIG. 10, firstly, the pattern P22 in the position evaluation pattern 60 is formed at a portion of the base 11, at which the first sealing layer 34a and the second sealing layer 34c are stacked. Then, in the formation process of the color filter 36, the pattern P31 is formed with a photosensitive resin material which does not include a color material, similarly to the convex portion 35. The pattern P21 is formed with a photosensitive resin material including a color material, similarly to the coloring layers 36R, 36G, and 36B. The portion at which the position evaluation pattern 60 is provided nearly faces a portion of the case member 101, which covers the portion of the base 11, which protrudes from the counter substrate 40. The pattern P21 or the pattern P22 surrounding the pattern P31 is not limited to being formed on the second sealing layer 34c, and may be formed on the first sealing layer 34a or on a layer lower than the first sealing layer 34a.

The organic EL device 100 is a micro-display and the size of the pixel 19 is significantly smaller than the size of a direct view type display. Thus, if display characteristics such as viewing angle characteristics are considered, it is necessary that high formation precision of the convex portion 35 and the coloring layers 36R, 36G, and 36B of the color filter 36 in the subpixel 18 is realized. In the exemplary embodiment, as illustrated in FIG. 6, the dimension evaluation pattern 50 and the position evaluation pattern 60 as the evaluation pattern of the color filter 36 are provided on the base 11 of the element substrate 10. Since levels of management characteristics required for the dimension precision and the position precision in the color filter 36 are not necessarily equal to each other, the dimension evaluation pattern 50 and the position evaluation pattern 60 can be provided in consideration of the levels required for the dimension precision and the position precision.

In accordance with the size of the pixel 19 or the form of the subpixel 18, a relative position of the dimension evaluation pattern 50 on the base 11 may be measured, the position precision of the color filter 36 may be specified, and the position evaluation pattern 60 may be omitted. In other words, the evaluation pattern in the invention may include at least the dimension evaluation pattern 50.

Manufacturing Method of Electrooptical Device

Figure 11:
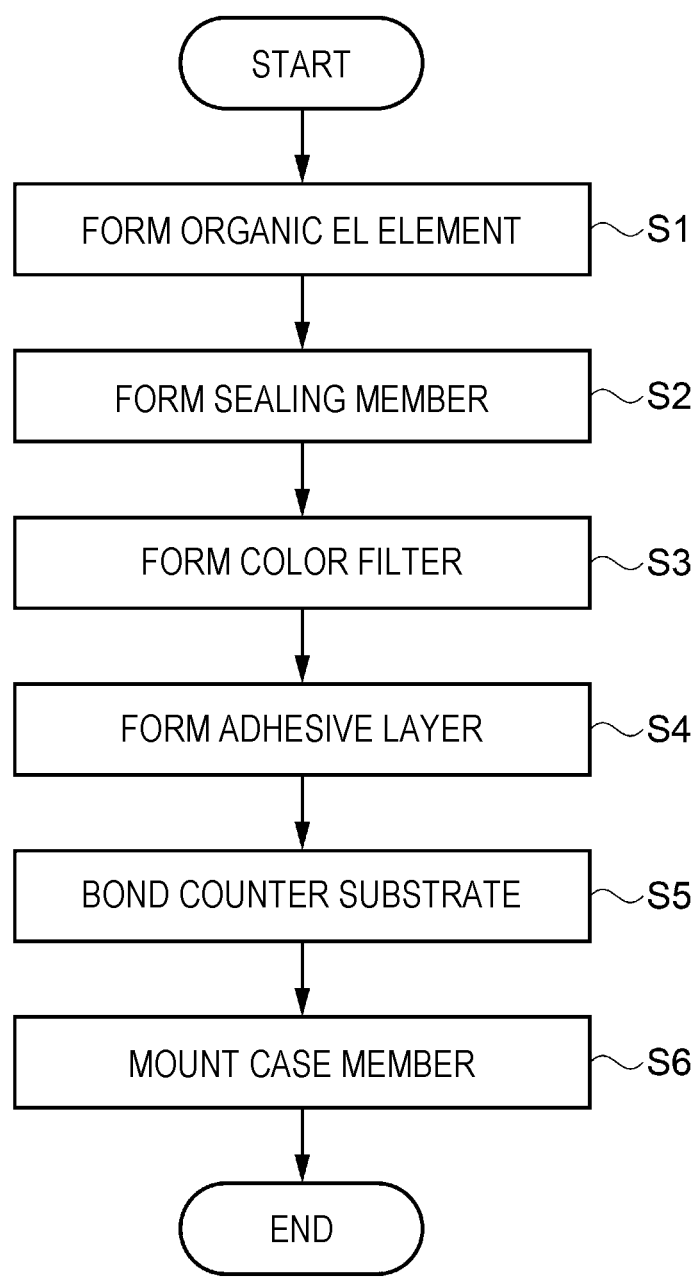
FIG. 11 is a flowchart illustrating a manufacturing method of the organic EL device in the first exemplary embodiment.
Figure 12:
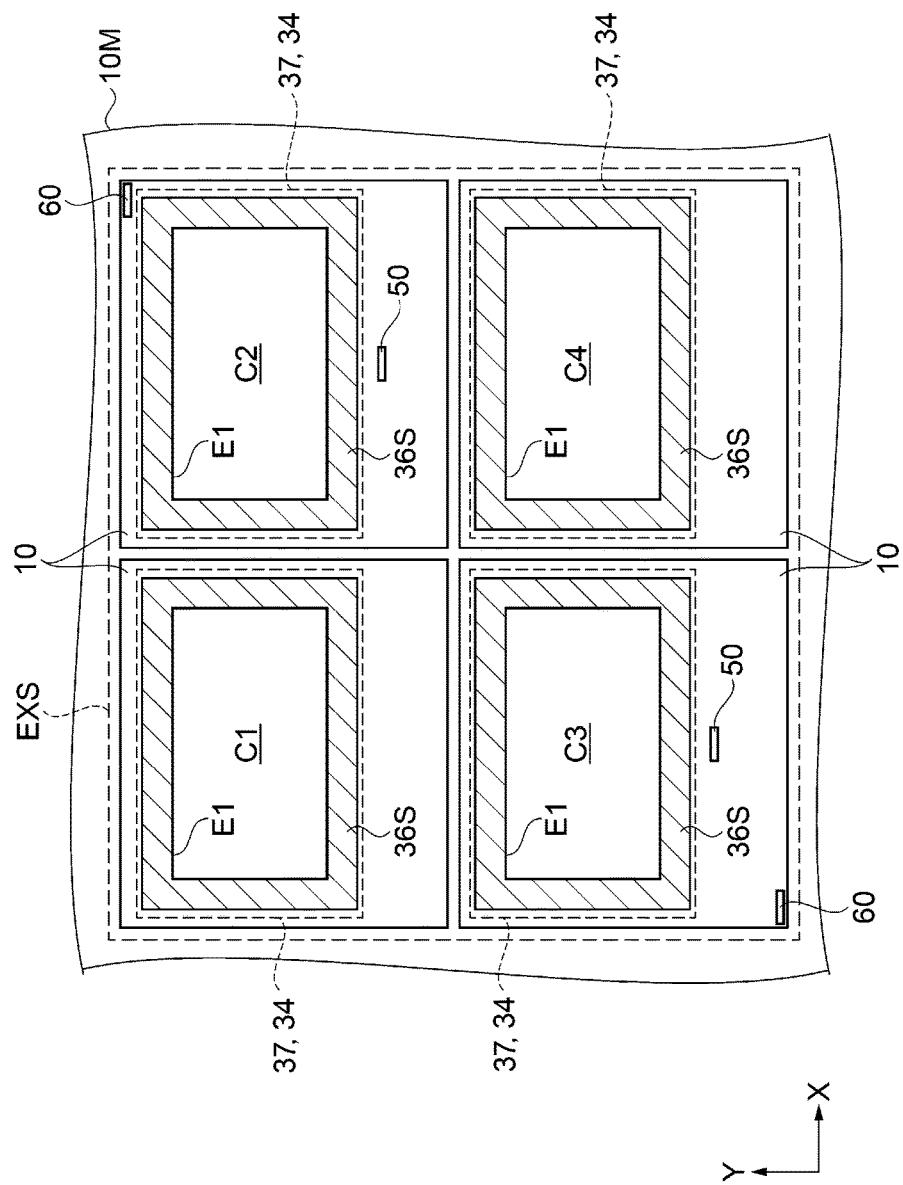
FIG. 12 is a plan view schematically illustrating a state where element substrates (bases) are surface-mounted on a mother substrate.

Next, a manufacturing method of the organic EL device 100 as the electrooptical device in the exemplary embodiment will be described with reference to FIGS. 11 and 12. FIG. 11 is a flowchart illustrating the manufacturing method of the organic EL device. FIG. 12 is a plan view schematically illustrating a state where element substrates (bases) are surface-mounted on a mother substrate.

As illustrated in FIG. 11, the manufacturing method of the organic EL device 100 in the exemplary embodiment includes a process (Step S1) of forming an organic EL element 30 on a base 11, a process (Step S2) of forming a sealing member 37, a process (Step S3) of forming a color filter 36, a process (Step S4) of forming an adhesive layer 42, a process (Step S5) of bonding an element substrate 10 and a counter substrate 40 to each other with the adhesive layer 42 interposed therebetween, and a process (Step S6) of mounting a case member 101. A process of forming a peripheral circuit such as a data line driving circuit 15 and a scan line driving circuit 16, a pixel circuit 20, wirings of connecting the circuits, an external connection terminal 102, and the like on the base 11 can be used by the well-known method as described above. The above descriptions are similarly applied to the reflective layer 25 or the translucent layer 26. Thus, descriptions will be made from Step S1.

In the process (Step S1) of forming an organic EL element 30, a pixel electrode 31 is formed for each subpixel 18 in a display area E1, a light emission function layer 32 and a counter electrode 33 are formed to cross over a plurality of subpixels 18, and thereby the organic EL element 30 is formed for each of the subpixels 18. Then, the process proceeds to Step S2.

In the process (Step S2) of forming a sealing member 37, a first sealing layer 34a is formed by using an inorganic material so as to cover a plurality of organic EL elements 30 formed in the display area E1, specifically, counter electrodes 33. An organic sealing layer is formed by using a resin material, and the organic sealing layer is patterned, and thereby a flattening layer 34b is formed. A second sealing layer 34c is formed by using an inorganic material so as to cover the flattening layer 34b and to cover the first sealing layer 34a which protrudes from the flattening layer 34b. Thus, the sealing layer 34 is formed, and a sealing member 37 including the sealing layer 34 is completed. Simultaneously, a pedestal member 34D having the same layer configuration as that of the sealing layer 34 is formed between the end portion of the base 11 and the end portion of the sealing member 37. Then, the process proceeds to Step S3.

In the process (Step S3) of forming a color filter 36, firstly, coating with a photosensitive resin material which does not include a color material is performed to cover the sealing member 37, and thereby a transparent photosensitive resin layer is formed. The photosensitive resin layer is exposed and developed by a photolithography method, and thus a convex portion 35, a pattern group 51 in a dimension evaluation pattern 50, and a pattern P31 of a pattern group 61 in a position evaluation pattern 60 are formed together.

Then, coating with a photosensitive resin material including a green color material (G) is performed, and thereby a green (G) photosensitive resin layer that covers the convex portion 35 is formed. The green (G) photosensitive resin layer is exposed and developed by a photolithography method, and thus a coloring layer 36G filling a space between predetermined convex portions 35 which are adjacent to each other, a pattern group 50G in the dimension evaluation pattern 50, and a pattern P21 of a pattern group 60G in the position evaluation pattern 60 are formed. Then, coating with a photosensitive resin material including a blue color material (B) is performed, and thereby a blue (B) photosensitive resin layer that covers the convex portion 35 and the coloring layer 36G is formed. The blue (B) photosensitive resin layer is exposed and developed by a photolithography method, and thus a coloring layer 36B filling a space between predetermined convex portions 35 which are adjacent to each other, a pattern group 50B in the dimension evaluation pattern 50, and a pattern P21 of a pattern group 60B in the position evaluation pattern 60 are formed. Coating with a photosensitive resin material including a red color material (R) is performed, and thereby a red (R) photosensitive resin layer that covers the convex portion 35, the coloring layer 36G, and the coloring layer 36B is formed. The red (R) photosensitive resin layer is exposed and developed by a photolithography method, and thus a coloring layer 36R filling a space between predetermined convex portions 35 which are adjacent to each other, a pattern group 50R in the dimension evaluation pattern 50, and a pattern P21 of a pattern group 60R in the position evaluation pattern 60 are formed. In the non-display area E2, the three coloring layers 36G, 36B, and 36R are stacked on the sealing layer 34 in this order, and patterning is performed, and thereby a CF light shielding member 36S is formed. The dimension evaluation pattern 50 is formed at a position satisfying Expression (2) described above, on the pedestal member 34D. The position evaluation pattern 60 is formed at the corner of the base 11. Then, the process proceeds to Step S4.

In the process (Step S4) of forming an adhesive layer 42, coating with an adhesive is performed to cover the color filter 36 and the dimension evaluation pattern 50 of the element substrate 10, and thereby the adhesive layer 42 is formed. Then, the process proceeds to Step S5.

In the bonding process (Step S5), the element substrate 10 and the counter substrate 40 are bonded to each other with the adhesive layer 42 interposed between the element substrate 10 and the counter substrate 40, and then the adhesive layer 42 is hardened. Then, the process proceeds to Step S6.

In the process (Step S6) of mounting a case member 101, the frame-like case member 101 which has an opening portion corresponding the display area E1 is mounted to cover the counter substrate 40.

In practice, as illustrated in FIG. 12, the processes of Step S1 to Step S5 are performed by using a mother substrate 10M on which a plurality of element substrates 10 (bases 11) are surface-mounted in the X-direction and the Y-direction in a matrix manner, in design. In the process (Step S3) of forming a color filter 36 by using a photolithography method, when exposure is performed once, step exposure is performed by using an exposure reticle (exposure mask) EXS. The exposure reticle EXS can simultaneously perform exposure of the plurality of bases 11 (for example, four bases 11 of C1 to C4 as illustrated in FIG. 12) as an exposure target. In the step exposure, the position of the exposure reticle EXS with respect to the mother substrate 10M is changed for each of one exposure. As described above, in a case using the exposure reticle EXS, an exposure pattern corresponding to the dimension evaluation pattern 50 and the position evaluation pattern 60 is not necessarily provided corresponding all C1 to C4. The exposure pattern may be provided corresponding to C2 and C3 which are positioned in a diagonal direction.

That is, in the process of forming a color filter 36, the convex portion 35, the coloring layers 36R, 36G, and 36B, and the evaluation pattern are formed on the mother substrate 10M by using the mother substrate 10M on which the plurality of bases 11 are surface-mounted, a formation material of the color filter 36, and the exposure reticle EXS which can simultaneously perform exposure of at least two bases 11 or more, and by using a photolithography method. The exposure reticle EXS has an exposure pattern which allows exposure of at least two evaluation patterns for the base 11. Four exposure reticles EXS are prepared in total, in order to correspond to the convex portion 35 and the coloring layers 36R, 36G, and 36B of the three colors.

In the process of forming the color filter 36, at a state at which each of the convex portion 35 and the coloring layers 36R, 36G, and 36B is formed, the bases 11 (in this case, C2 and C3) on which the corresponding dimension evaluation pattern 50 and the corresponding position evaluation pattern 60 are formed are specified, and dimensions, the position, and the like are measured. It is determined whether formation precision of the color filter 36 which has been formed is in a desired state, based on the measurement result. If the precision is poor, processing of changing formation conditions and the like is performed. Since it is possible to easily specify the base 11 as the measurement target in the mother substrate 10M, and measuring evaluation patterns of all bases 11 which are surface-mounted is not required, the work is easily performed.

Figure 13:
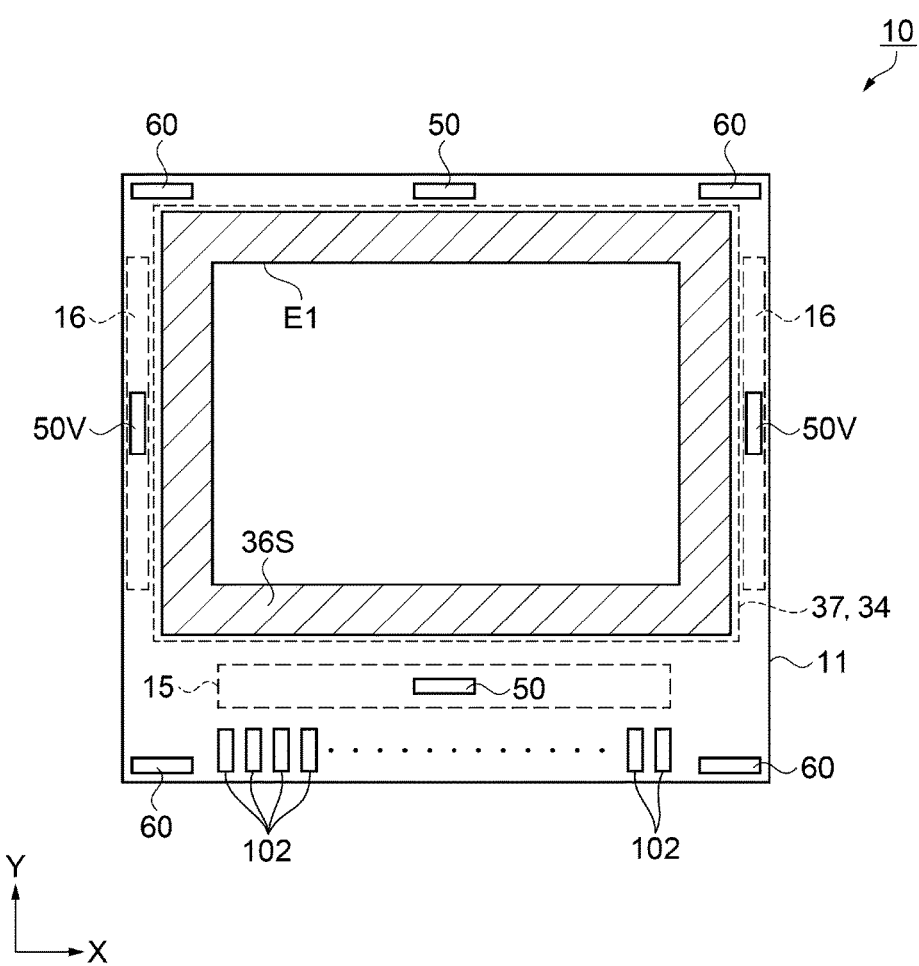
FIG. 13 is a plan view schematically illustrating another arrangement example of the evaluation pattern in the element substrate.
Figure 14:
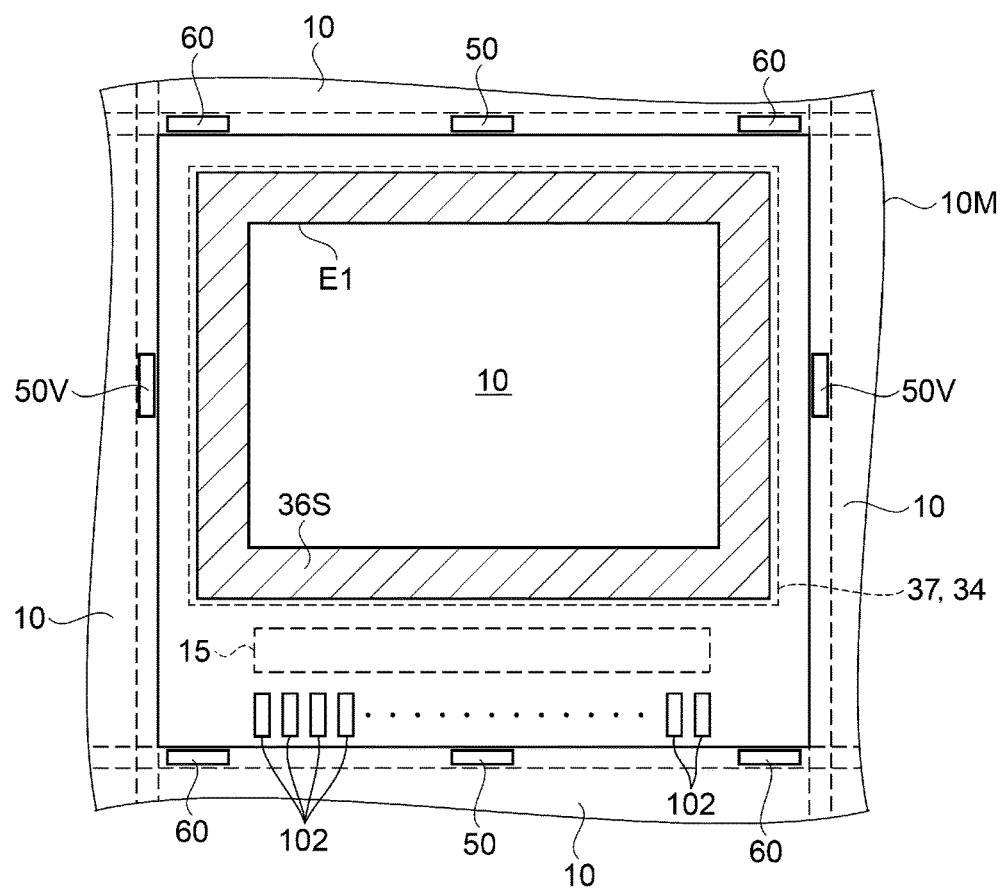
FIG. 14 is a plan view schematically illustrating another arrangement example of the evaluation pattern in the mother substrate.

Next, another arrangement example of evaluation patterns in the element substrate 10 will be described with reference to FIGS. 13 and 14. FIG. 13 is a plan view schematically illustrating another arrangement example of the evaluation patterns in the element substrate. FIG. 14 is a plan view schematically illustrating another arrangement example of the evaluation patterns in the mother substrate.

As illustrated in FIG. 13, the dimension evaluation pattern 50 may be disposed on the outside of the CF light shielding member 36S so as to overlap the data line driving circuit 15 in plan view, and may be provided between the end portion of the element substrate 10 and the end portion of the sealing member 37 including the sealing layer 34, on an opposite side of the data line driving circuit 15 with the display area E1 interposed between the dimension evaluation pattern 50 and the data line driving circuit 15 in the Y-direction.

The dimension evaluation pattern 50 is not limited to being disposed at a position in the X-direction with respect to the CF light shielding member 36S surrounding the display area E1. A dimension evaluation pattern 50V disposed in the Y-direction may be provided between the end portion of a side of the element substrate 10 in the Y-direction and the end portion of the sealing member 37 including the sealing layer 34. In the dimension evaluation pattern 50V, the pattern groups 50R, 50G, 50B, and 51 of the dimension evaluation pattern 50 illustrated in FIG. 7 are arranged in the Y-direction in this order. An extension direction of the plurality of patterns P1 to P5 and the plurality of patterns P11 to P15 is in a state corresponding to the arrangement of the convex portion 35 and the coloring layers 36R, 36G, and 36B in the display area E1. In other words, the dimension evaluation pattern 50 can be disposed to correspond to the arrangement of the convex portion 35 and the coloring layers 36R, 36G, and 36B in the display area E1 and to depend on a state of the space between the end portion of the element substrate 10 and the end portion of the sealing member 37.

In a case using the mother substrate 10M, the dimension evaluation pattern 50 is not necessarily limited to being disposed on the element substrate 10. As illustrated in FIG. 14, in a case where a plurality of element substrates 10 are arranged (formed) to be spaced from each other in the X-direction and the Y-direction in the mother substrate 10M, the dimension evaluation pattern 50 (50V) or the position evaluation pattern 60 may be disposed in this space. The dimension evaluation pattern 50 (50V) or the position evaluation pattern 60 may be in a state of being usable when the color filter 36 is formed by using the mother substrate 10M, and may have a configuration in which this space of the mother substrate 10M is subjected to dicing so as to take an organic EL panel out. If dicing is performed in this manner, the evaluation pattern does not remain on the element substrate 10. Thus, considering light leakage occurring by providing the evaluation patterns is not necessary. However, it is not possible to analyze whether or not formation precision of the color filter 36 in an organic EL panel after completion is in a desired state, later by using the evaluation patterns. In other words, if the evaluation pattern is caused to remain on the element substrate 10, an effect in that it is possible to analyze whether or not the formation precision of the color filter 36 is in a desired state, later by using the evaluation patterns.

According to the organic EL device 100 and the manufacturing method thereof in the first exemplary embodiment, the following effects are obtained.

(1) The dimension evaluation pattern 50 for evaluating management characteristics such as dimensions or the position of the color filter 36 is disposed on the pedestal member 34D provided between the end portion of the base 11 and the end portion of the sealing member 37, on the base 11. The pedestal member 34D has the same layer configuration as that of the sealing layer 34 that seals the organic EL element 30. The height of the sealing member 37 including the sealing layer 34 on the base 11 is equal to the height of the pedestal member 34D. Thus, when the color filter 36 is formed by a photolithography method, the positions of the convex portion 35 and the coloring layers 36R, 36G, and 36B on the base 11 during exposing is substantially the same as the position of the dimension evaluation pattern 50. Accordingly, formation precision of the convex portion 35 and the coloring layers 36R, 36G, and 36B is substantially equivalent to formation precision of the dimension evaluation pattern 50. If the dimension evaluation pattern 50 disposed in this manner is measured, it is possible to suitably obtain information regarding management characteristics relating to formation precision of the convex portion 35 and the coloring layers 36R, 36G, and 36B even though coloring layers having different colors are disposed to overlap each other on the convex portion 35 in the display area E1. If formation conditions of the convex portion 35 and the coloring layers 36R, 36G, and 36B are managed based on the information of the management characteristics in the process of forming the color filter 36, it is possible to form the convex portion 35 and the coloring layers 36R, 36G, and 36B for the organic EL element 30 in the subpixel 18 of each color, with high precision. That is, it is possible to provide or manufacture the organic EL device 100 in which the color filter 36 with the convex portion 35 is disposed for the organic EL element 30 with high precision, in the subpixel 18 of each color.

(2) The pedestal member 34D and the dimension evaluation pattern 50 are formed on the base 11 so as to cause the distance Lp from the end portion of the case member 101 as the light shielding member on the display area E1 side to the end portion of the dimension evaluation pattern 50 to satisfy Expression (2).

$$Lp > L1 \times \tan\theta_1 + L2 \times \tan\theta_2 + L3 \times \tan\theta_3 \qquad (2)$$

L1 indicates the thickness of the adhesive layer 42 between the dimension evaluation pattern 50 and the counter substrate 40 in the Z-direction. L2 indicates the thickness of the counter substrate 40. L3 indicates the length of the gap between the counter substrate 40 and the case member 101 in the Z-direction. The angle $\theta_1$ is an angle to the normal line when inclined light emitted in the direction inclined from the normal line of the end portion of the dimension evaluation pattern 50 is transmitted through the adhesive layer 42. The angle $\theta_2$ is an angle to the normal line when the inclined light which has been incident at the angle $\theta_1$ is transmitted through the counter substrate 40. The angle $\theta_3$ is an angle when the inclined light which has been incident at the angle $\theta_2$ is transmitted through the air layer between the counter substrate 40 and the case member 101 and then is leaked from the end portion of the case member 101 on the display area E1 side.

According to this, it is possible to prevent light leakage occurring by providing the dimension evaluation pattern 50 on the pedestal member 34D. The angle $\theta_3$ is defined in consideration of the uptake angle $\theta g$ of the condensing optical system 1002.

(3) The dimension evaluation pattern 50 includes the pattern groups 50R, 50G, 50B, and 51 as the color pattern. Each of the pattern groups 50R, 50G, 50B, and 51 includes a plurality of patterns which are separate from each other. According to this, in comparison to a case where the dimension evaluation pattern 50 is configured with one pattern for each color (including a case of being transparent), it is possible to suppress an occurrence of a situation in which the pattern is damaged or disappears, by over exposing or over developing in the photolithography method. In other words, since the dimension evaluation pattern 50 is reliably formed and is measured, it is possible to obtain information regarding the management characteristics of the convex portion 35 and the coloring layers 36R, 36G, and 36B.

(4) The color pattern of the dimension evaluation pattern 50 is configured with a plurality of patterns. At least one of the patterns has a shape which is different from the shapes (in the exemplary embodiment, the length of the one in the X-direction is longer than those of other patterns) of other patterns. Thus, it is possible to easily specify a pattern as the measurement target.

(5) The position evaluation pattern 60 for evaluating the position precision of the color filter 36 is provided to be separate from the dimension evaluation pattern 50. In a case where the level of the management characteristics required for the dimension evaluation pattern 50 is different from the level of the management characteristics required for the position evaluation pattern 60, it is effective that the position evaluation pattern 60 is separately provided. If the position evaluation pattern 60 is provided at the corner of the element substrate 10, which protrudes from the counter substrate 40, concern about light leakage occurring by providing the position evaluation pattern 60 is not necessary. In a case where the position evaluation pattern 60 is provided in the vicinity of the end portion of the sealing member 37, it is preferable that the position evaluation pattern 60 be provided at the position satisfying Expression (2). The position evaluation pattern 60 may be disposed on the pedestal member 34D, similarly to the dimension evaluation pattern 50.

Second Exemplary Embodiment

Figure 15:
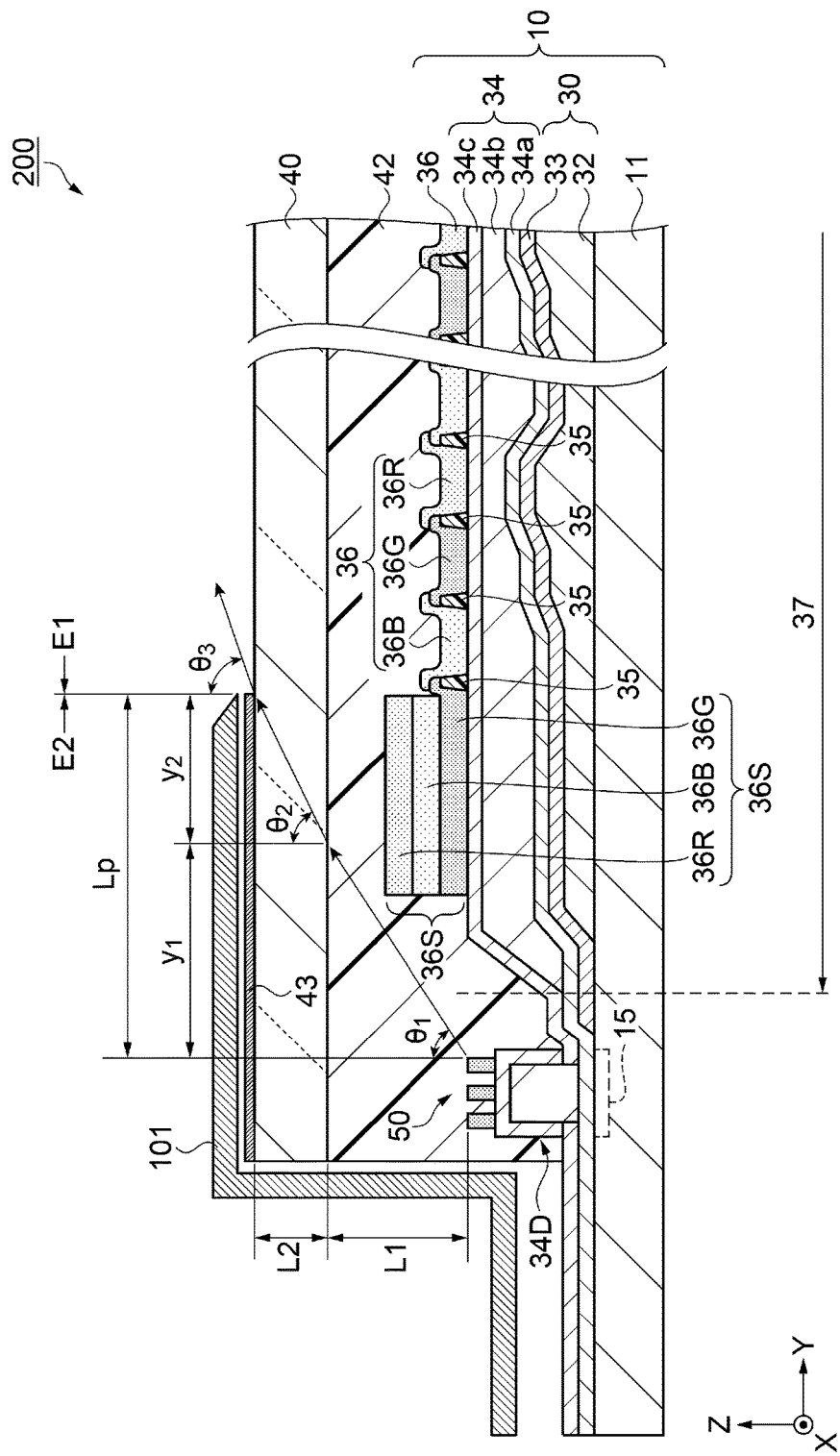
FIG. 15 is a sectional view schematically illustrating a structure of an organic EL device according to a second exemplary embodiment.

Next, an organic EL device as an electrooptical device according to a second exemplary embodiment will be described with reference to FIG. 15. FIG. 15 is a sectional view schematically illustrating a structure of the organic EL device in the second exemplary embodiment. In the organic EL device in the second exemplary embodiment, the configuration of a light shielding member is different from that of the light shielding member for the organic EL device 100 in the first exemplary embodiment. Since other components are the same as those in the organic EL device 100, components which are the same as those in the organic EL device 100 are denoted by the same reference signs and detailed descriptions thereof will not be repeated. FIG. 15 is a sectional view corresponding to the line IX-IX in FIG. 6 which illustrates the structure of the organic EL device 100 in the first exemplary embodiment.

As illustrated in FIG. 15, an organic EL device 200 as the electrooptical device in the exemplary embodiment includes an element substrate 10 and a counter substrate 40 which are bonded to each other with an adhesive layer 42 interposed therebetween. As described in the first exemplary embodiment, the element substrate 10 includes an organic EL element 30 disposed for each subpixel 18 in a display area E1, a sealing member 37 including a sealing layer 34 that covers the organic EL element 30, and a color filter 36 provided on the sealing layer 34. The element substrate 10 includes a pedestal member 34D provided between the end portion of a base 11 and the end portion of the sealing member 37, and a dimension evaluation pattern 50 which is provided on the pedestal member 34D and is provided for evaluating the color filter 36.

The organic EL device 200 includes a frame-like case member 101 provided to surround the display area E1, on a side of the counter substrate 40 to which display light is emitted. A light shielding layer 43 which is provided on the surface of the counter substrate 40 as the light shielding member is provided between the case member 101 and the counter substrate 40. The light shielding layer 43 is provided over the non-display area E2 so as to have a frame shape and to surround the display area E1. The light shielding layer 43 can be formed by using metal or alloys thereof, or a resin layer including a black pigment or the like which has light absorbency.

The light shielding layer 43 is provided on the counter substrate 40 so as to cause the end portion of the light shielding layer 43 on the display area E1 side and the end portion of the display area E1 to have the same position. Inclined light (stray light) which is emitted from the end portion of the dimension evaluation pattern 50 on the display area E1 side at the angle $\theta_1$ to the normal line in the inclined direction is transmitted through the adhesive layer 42 and then is incident to the counter substrate 40. If the inclined light (stray light) which has been incident to the counter substrate 40 at the angle $\theta_1$ is transmitted at the angle $\theta_2$ through the counter substrate 40 and then is emitted from the end portion of the light shielding layer 43 toward the case member 101, the inclined light is mixed with display light because of being emitted at the angle $\theta_3$.

If the end portion of the light shielding layer 43 on the display area E1 side in the Y-direction and the end portion of the display area E1 are set to have the same position, since the adhesive layer 42 and the counter substrate 40 are interposed between the dimension evaluation pattern 50 and the light shielding layer 43, Expression (4) is obtained by applying this point to Expression (1) in the first exemplary embodiment.

$$Lp > L1 \times \tan \theta_1 + L2 \times \tan \theta_2 \quad (4)$$

That is, the distance Lp from the end portion of the light shielding layer 43 on the display area E1 side to the end portion of the dimension evaluation pattern 50 is given to Expression (4). In other words, in comparison to the first exemplary embodiment, it is possible to reduce the shortest distance from the end portion of the light shielding layer 43 (as the light shielding member) on the display area E1 side to the end portion of the dimension evaluation pattern 50.

According to the second exemplary embodiment, the following effect is obtained in addition to the effects (1), (3), (4), and (5) in the first exemplary embodiment.

(6) Since the light shielding layer 43 is formed on a surface on the outside of the counter substrate 40 to which display light is emitted, it is possible to reliably block stray light occurring by providing the dimension evaluation pattern 50 by the light shielding layer 43 and to prevent an influence of the stray light on display light, even if a mounting position of the case member 101 on the counter substrate 40 slightly varies.

Third Exemplary Embodiment

Figure 16:
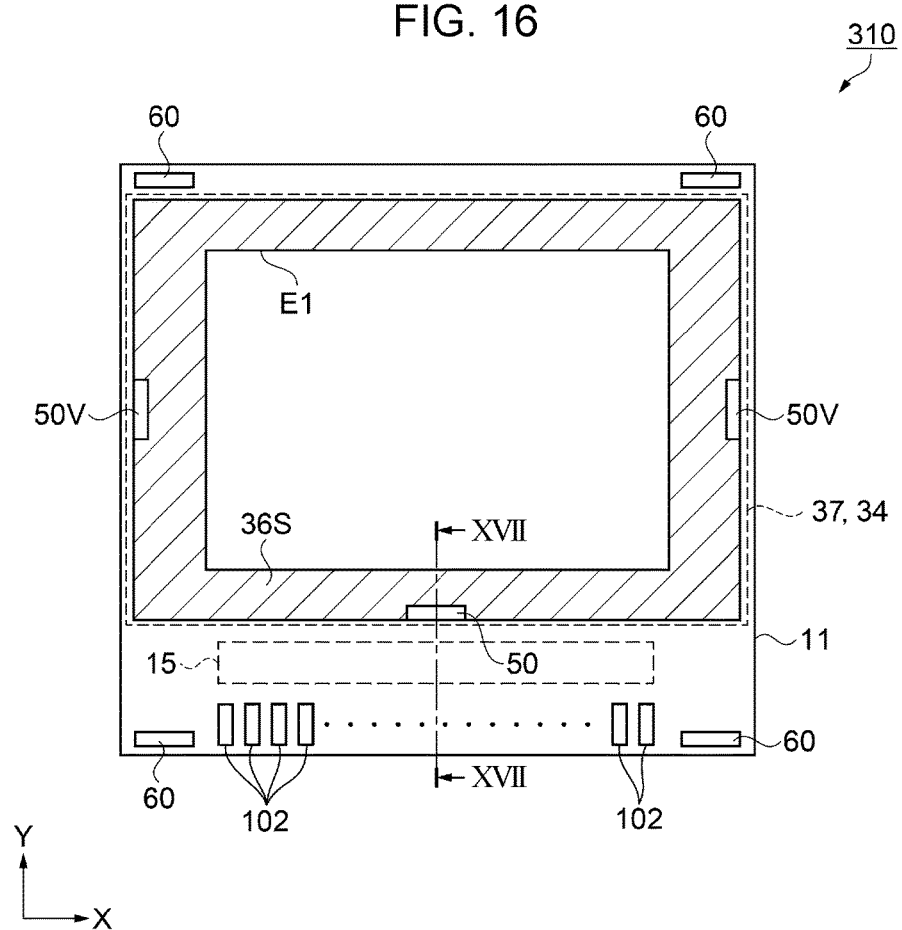
FIG. 16 is a plan view schematically illustrating an arrangement example of an evaluation pattern in an element substrate of an organic EL device according to a third exemplary embodiment.
Figure 17:
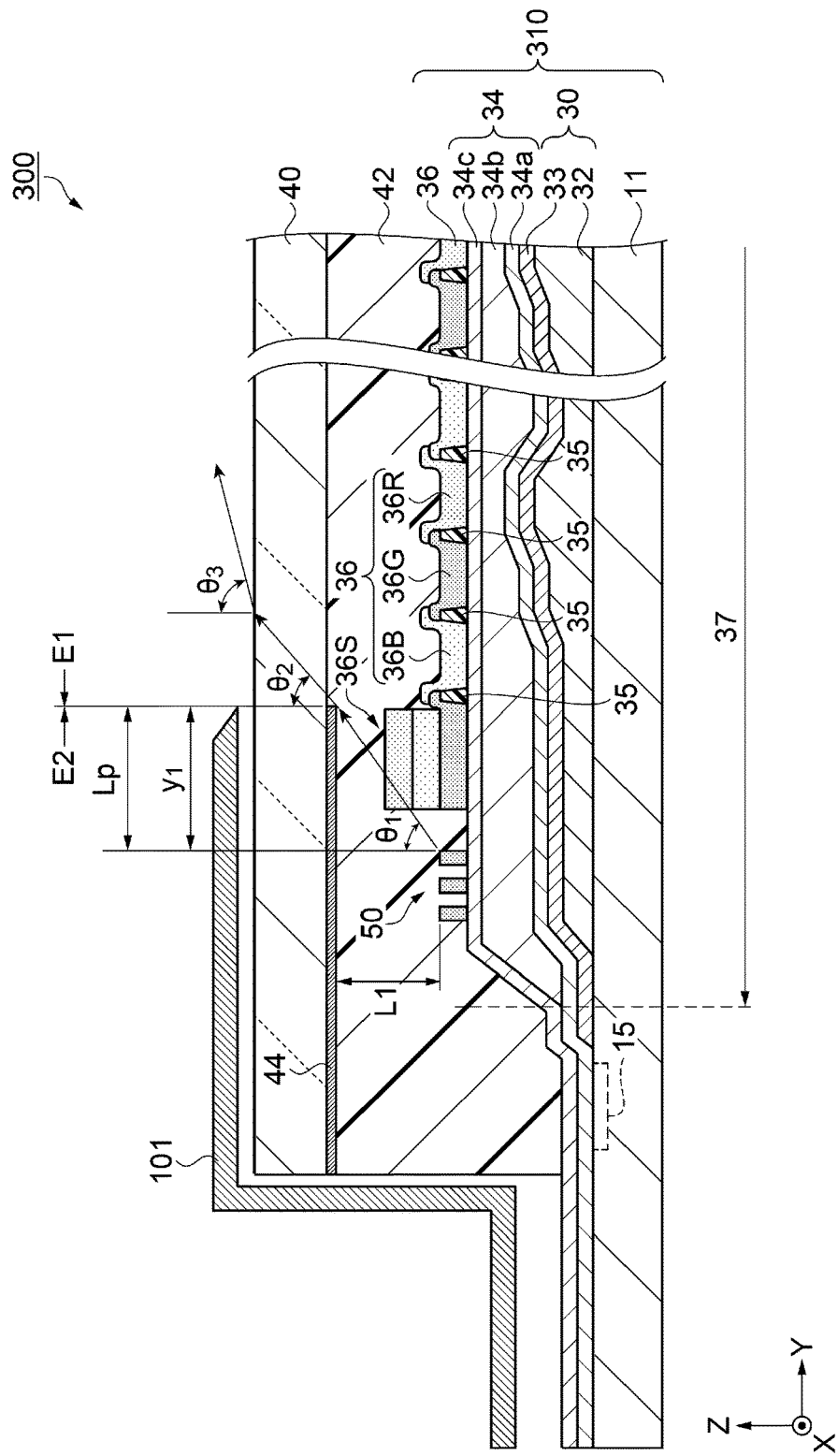
FIG. 17 is a sectional view schematically illustrating a structure of the organic EL device taken along line XVII-XVII in FIG. 16, in the third exemplary embodiment.

Next, an organic EL device as an electrooptical device according to a third exemplary embodiment will be described with reference to FIGS. 16 and 17. FIG. 16 is a plan view schematically illustrating an arrangement example of an evaluation pattern in an element substrate of the organic EL device in the third exemplary embodiment. FIG. 17 is a sectional view schematically illustrating a structure of the organic EL device taken along line XVII-XVII in FIG. 16, in the third exemplary embodiment. The organic EL device in the third exemplary embodiment is different from the organic EL device 100 in the first exemplary embodiment in that the configuration of the light shielding member is different and arrangement of the dimension evaluation pattern 50 is different. Since other components are the same as those in the organic EL device 100, components which are the same as those in the organic EL device 100 are denoted by the same reference signs and detailed descriptions thereof will not be repeated.

As illustrated in FIG. 16, an element substrate 310 in the electrooptical device in the exemplary embodiment includes a CF light shielding member 36S disposed to surround a display area E1. The CF light shielding member 36S is provided on a sealing layer 34 of a sealing member 37. The dimension evaluation pattern 50 for evaluating dimensions, the shape, and the like of a color filter 36 is provided at a position along the data line driving circuit 15 in a region in which the CF light shielding member 36S is formed. A dimension evaluation pattern 50V may be provided at a position along a side portion of the base 11 in the Y-direction, in accordance with the type of the color filter 36. In this case, the position of the CF light shielding member 36S on the end portion side of the base 11 is the same as positions of end portions of the dimension evaluation patterns 50 and 50V.

A position evaluation pattern 60 is disposed at the four corners of the base 11. The position evaluation pattern 60 may be disposed in at least one place among the four corners.

As illustrated in FIG. 17, the organic EL device 300 as the electrooptical device in the exemplary embodiment includes an element substrate 310 and a counter substrate 40 which are bonded to each other with an adhesive layer 42 interposed therebetween. The element substrate 310 includes an organic EL element 30 disposed for each subpixel 18 in a display area E1, a sealing member 37 including a sealing layer 34 that covers the organic EL element 30, and a color filter 36 provided on the sealing layer 34. In the element substrate 310, the dimension evaluation pattern 50 for evaluating the color filter 36 is disposed on the sealing layer 34.

The organic EL device 300 includes a frame-like case member 101 provided to surround the display area E1, on a side of the counter substrate 40 to which display light is emitted. A light shielding layer 44 as an example of the light shielding member is provided at an interface between the counter substrate 40 and the adhesive layer 42. The light shielding layer 44 is provided over the non-display area E2 so as to have a frame shape and to surround the display area E1. The light shielding layer 44 can be formed by using metal or alloys thereof, or a resin layer including a black pigment or the like which has light absorbency.

The light shielding layer 44 is provided on the counter substrate 40 so as to cause the end portion of the light shielding layer 44 on the display area E1 side and the end portion of the display area E1 to have the same position. Inclined light (stray light) which is emitted from the end portion of the dimension evaluation pattern 50 on the display area E1 side at the angle $\theta_1$ to the normal line in the inclined direction is transmitted through the adhesive layer 42 and then is incident to the counter substrate 40. If the inclined light (stray light) which has been incident to the counter substrate 40 at the angle $\theta_1$ is transmitted at the angle $\theta_2$ through the counter substrate 40 and then is leaked from the end portion of the light shielding layer 44, the inclined light is mixed with display light which is emitted toward the case member 101 side at the angle $\theta_3$.

In the exemplary embodiment, since the light shielding layer 44 as the light shielding member is disposed to be close to the dimension evaluation pattern 50 in the Z-direction, stray light which is emitted in the direction inclined from the end portion of the dimension evaluation pattern 50 is easily blocked by the light shielding layer 44. Thus, it is possible to dispose the dimension evaluation pattern 50 at a position close to the display area E1. If the end portion of the light shielding layer 44 on the display area E1 side in the Y-direction and the end portion of the display area E1 have the same position, the translucent member disposed between the light shielding layer 44 and the dimension evaluation pattern 50 includes only the adhesive layer 42. Thus, if the configuration of the organic EL device 300 in the exemplary embodiment is applied to Expression (1) described in the first exemplary embodiment, Expression (5) is obtained.

$$Lp > L1 \times \tan \theta_1 \quad (5)$$

That is, the distance Lp from the end portion of the light shielding layer 44 on the display area E1 side to the end portion of the dimension evaluation pattern 50 is given to Expression (5).

Thus, considering the thickness L2 of the counter substrate 40 is not required, and it is possible to reduce the shortest distance from the end portion of the light shielding layer 44 on the display area E1 side to the end portion of the dimension evaluation pattern 50, in comparison to the first exemplary embodiment or the second exemplary embodiment. Therefore, the dimension evaluation pattern 50 can be provided on the sealing layer 34. In addition, if the CF light shielding member 36S is set to be disposed on the display area E1 side of the dimension evaluation pattern 50, it is possible to block a portion of stray light leaked from the end portion of the dimension evaluation pattern 50 by the CF light shielding member 36S.

According to the third exemplary embodiment, the following effect is obtained in addition to the effects (3), (4), and (5) in the first exemplary embodiment.

(7) In the organic EL device 300, the color filter 36 and the dimension evaluation pattern 50 are disposed on the sealing layer 34 of the element substrate 310. Since the positions (heights) of the coloring layers 36R, 36G, and 36B and the dimension evaluation pattern 50 on the base 11 are the same, it is possible to suitably obtain information regarding formation precision of the convex portion 35 and the coloring layers 36R, 36G, and 36B in the color filter 36 by measuring the dimension evaluation pattern 50.

(8) Since the light shielding layer 44 as the light shielding member is formed at the interface with the adhesive layer 42 of the counter substrate 40 to which display light is emitted, similarly to the effect (6) in the second exemplary embodiment, it is possible to reliably block stray light occurring by providing the dimension evaluation pattern 50 by the light shielding layer 44 and to prevent an influence on display light, even if the mounting position of the case member 101 on the counter substrate 40 slightly varies. Further, it is possible to further reduce the shortest distance relating to the position at which the dimension evaluation pattern 50 is provided on the base 11, in comparison to the first exemplary embodiment or the second exemplary embodiment. Therefore, since the dimension evaluation pattern 50 can be disposed on the sealing layer 34, it is not necessary that the pedestal member 34D for disposing the dimension evaluation pattern 50 is provided as in the first exemplary embodiment. That is, since a space for providing the pedestal member 34D is not required, it is possible to reduce the size of the element substrate 310 and to reduce the size of the organic EL device 300.

The invention is not limited to the above-described exemplary embodiments, and can be appropriately changed in a range without departing from the gist or the concept of the invention read from the claims and the entirety of the specification. An electrooptical device and a manufacturing method of the electrooptical device obtained by such a change, and electronic equipment to which the electrooptical device is applied are also included in the technical range of the invention. Various modification examples are considered in addition to the exemplary embodiments. Modification examples will be described below as an example.

Modification Example 1

In the first exemplary embodiment, the layer configuration of the pedestal member 34D on which the dimension evaluation pattern 50 is disposed is the same as that of the sealing layer 34. However, it is not limited thereto. The pedestal member 34D may be configured by using other components so as to have a height which is substantially equal to the height of the sealing layer 34 on the base 11. In this case, if the pedestal member 34D is configured by using a member having a light blocking property, it is possible to block stray light relating to the organic EL element 30 by the pedestal member 34D having a light blocking property.

Modification Example 2

In the first exemplary embodiment, the patterns P22 of the pattern groups 60R, 60G, and 60B in the position evaluation pattern 60 are formed in a different process by using a different material, from the material and the process of the pattern P21. However, the invention is not limited to such a form. The pattern P22 may be formed with a photosensitive resin material which does not include a color material similarly to the convex portion 35, and the pattern P21 may be formed with a photosensitive resin material including color materials similar to the coloring layers 36B, 36G, and 36R. According to such a configuration, if the positions of the patterns P21 are measured based on the position of the pattern P22 which relates to the convex portion 35 and is formed ahead of the patterns P21 relating to the coloring layers 36B, 36G, and 36R, it is possible to evaluate position precision of each of the coloring layers 36B, 36G, and 36R.

Modification Example 3

In the exemplary embodiments, the pixel 19 includes subpixels 18 of the three colors (red (R), green (G), and blue (B)). However, it is not limited thereto. The pixel 19 may include, for example, a yellow (Y) subpixel 18 in addition to the subpixels 18 of the red color (R), the green color (G), and the blue color (B). According to the configuration of such a pixel 19, it is possible to further improve brightness or color reproducibility.

Modification Example 4

In the subpixel 18 in the exemplary embodiments, the center of the organic EL element 30 (pixel electrode 31) may not necessarily coincide with the center of the coloring layer having a stripe shape in the Y-direction. Considering an angle at which display light emitted from the display area E1 is incident to the condensing optical system 1002, the center of the coloring layer having a stripe shape may be disposed in the display area E1 with being adjusted for each subpixel 18. Specifically, as becoming farther from the optical axis of the condensing optical system 1002, the center of the coloring layer having a stripe shape with respect to the center of the organic EL element 30 in a subpixel 18 may be shifted more to the optical axis side. If the center thereof is disposed with being adjusted, it is possible to suppress color shift in the viewing angle characteristics, and to obtain color display having favorable showing. When the position of the coloring layer for the subpixel 18 is finely adjusted in this manner, it is effective that the dimension evaluation pattern 50 and the position evaluation pattern 60 are provided.

Modification Example 5

As described in the second exemplary embodiment and the third exemplary embodiment, in a case where the light shielding layer 43 or the light shielding layer 44 is provided on the counter substrate 40, in the organic EL device as the electrooptical device, the frame-like case member 101 which is provided on the side of the counter substrate 40 on which display light is emitted, so as to surround the display area E1 may not be provided. The case member 101 may be provided to cover only side surfaces of the counter substrate 40 and the adhesive layer 42 or to cover only a peripheral upper surface portion of the counter substrate 40.

Modification Example 6

Electronic equipment to which the organic EL device 100 (or organic EL device 200 or 300) as the micro-display can be applied is not limited to the head mount display (HMD) 1000 in the above exemplary embodiments. For example, the electronic equipment can be appropriately used, for example, in an electronic viewfinder of a digital camera or the like, a head-up display, a display unit of a portable type information terminal, and the like.

The entire disclosure of Japanese Patent Application No. 2017-058702, filed Mar. 24, 2017 is expressly incorporated by reference herein.

What is claimed is:

1. An electrooptical device comprising:
a substrate;
an organic EL element disposed for each pixel, in a first area of the substrate;
a sealing member that is provided in the first area and covers the organic EL element;
a color filter provided on the sealing member;
an evaluation pattern provided for evaluating the color filter; and
a pedestal member disposed between an end portion of the substrate and the sealing member,
wherein the evaluation pattern is disposed on the pedestal member.

2. The electrooptical device according to claim 1,
wherein a height of the pedestal member is substantially equal to a height of the sealing member, on the substrate.

3. The electrooptical device according to claim 2,
wherein the sealing member includes an organic sealing layer and inorganic sealing layers interposing the organic sealing layer, and
the pedestal member has a layer configuration which is the same as that of the sealing member.

4. An electrooptical device comprising:
a substrate;
an organic EL element disposed for each pixel, in a first area of the substrate;
a sealing member that is provided in the first area and covers the organic EL element;
a color filter provided on the sealing member;
an evaluation pattern provided for evaluating the color filter;
a light shielding member provided over the evaluation pattern, so as to surround the first area; and translucent members which are n layers and are provided between the evaluation pattern and the light shielding member,
wherein the evaluation pattern is provided at a position satisfying Expression (1)

$$Lp > \Sigma(Ln \times \tan \theta_n),$$

where n indicates an integer of 1 or more, Lp indicates a distance from an end portion of the light shielding member on the first area side to an end portion of the evaluation pattern in plan view, Ln indicates a thickness of each of the translucent members of n layers on the evaluation pattern, and $\theta_n$ indicates an angle of light to a normal line of each of the translucent members when the light emitted in a direction inclined from a normal line of an end portion of the evaluation pattern is transmitted to the translucent member.

5. The electrooptical device according to claim 4, further comprising:
a pedestal member disposed between an end portion of the substrate and the sealing member,
wherein the evaluation pattern is disposed on the pedestal member.

6. The electrooptical device according to claim 4,
wherein the translucent members of n layers include an adhesive layer configured to cover the color filter and the evaluation pattern and a counter substrate stacked on the adhesive layer.

7. The electrooptical device according to claim 6,
wherein the light shielding member is a case member provided to surround the first area, and
the adhesive layer and the counter substrate are disposed between the evaluation pattern and the case member.

8. The electrooptical device according to claim 6,
wherein the light shielding member is a light shielding layer provided at an interface between the counter substrate and the adhesive layer or on a surface of the counter substrate on an opposite side of the interface.

9. The electrooptical device according to claim 1,
wherein the evaluation pattern includes color patterns of at least three colors of red, green, and blue in order to evaluate dimension precision of a coloring layer of the color filter, and
the color patterns of at least three colors of red, green, and blue are arranged to be spaced from each other.

10. The electrooptical device according to claim 9,
wherein the color patterns include a plurality of patterns for each color, and
the plurality of patterns are arranged to be spaced from each other.

11. The electrooptical device according to claim 10,
wherein one of the plurality of patterns in the color pattern has a shape which is different from other patterns.

12. The electrooptical device according to claim 1, further comprising:
a position evaluation pattern provided on the substrate in order to evaluate position precision of a coloring layer of the color filter,
wherein the position evaluation pattern is provided to correspond to each of at least three colors of red, green, and blue.

13. Electronic equipment comprising:
the electrooptical device according to claim 1.
14. Electronic equipment comprising:
the electrooptical device according to claim 2.
15. Electronic equipment comprising:
the electrooptical device according to claim 3.

16. Electronic equipment comprising:
the electrooptical device according to claim 4.
17. Electronic equipment comprising:
the electrooptical device according to claim 5.
18. Electronic equipment comprising:
the electrooptical device according to claim 6.
19. A manufacturing method of an electrooptical device, the method comprising:
   forming an organic EL element for each pixel, in a first area of a substrate;
   forming a sealing member for covering the organic EL element over the first area;
   forming a color filter on the sealing member; and
   forming a pedestal member between an end portion of the substrate and the sealing member,
   wherein, in the forming of the color filter, a coloring layer of the color filter is formed by a photolithography method and an evaluation pattern for evaluating the color filter is formed on the pedestal member by the photolithography method with a formation material for the coloring layer.
20. The manufacturing method of an electrooptical device according to claim 19,
   wherein, in the forming of the color filter, the coloring layer and the evaluation pattern are formed on a mother substrate by a photolithography method and by using the mother substrate on which a plurality of substrates are surface-mounted, the formation material for the coloring layer of the color filter, and an exposure reticle which is capable of exposing at least two substrates or more together, and
   the exposure reticle includes an exposure pattern which is capable of exposing evaluation patterns of the at least two substrates.

* * * * *